United States Patent
Hwang et al.

(10) Patent No.: US 10,305,003 B2
(45) Date of Patent: May 28, 2019

(54) LIGHT-EMITTING DEVICE, PACKAGE INCLUDING THE SAME, AND METHOD OF MANUFACTURING THE SAME

(71) Applicant: Samsung Electronics Co., Ltd., Suwon-si (KR)

(72) Inventors: Kyung-wook Hwang, Hwaseong-si (KR); Dong-myung Shin, Hwaseong-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 15/866,968

(22) Filed: Jan. 10, 2018

(65) Prior Publication Data
US 2019/0019922 A1    Jan. 17, 2019

(30) Foreign Application Priority Data

Jul. 13, 2017 (KR) .................. 10-2017-0089168

(51) Int. Cl.
| | |
|---|---|
| H01L 23/52 | (2006.01) |
| H01L 33/48 | (2010.01) |
| H01L 33/40 | (2010.01) |
| H01L 33/24 | (2010.01) |
| H01L 33/64 | (2010.01) |
| H01L 33/62 | (2010.01) |
| H01L 33/56 | (2010.01) |
| H01L 33/54 | (2010.01) |

(52) U.S. Cl.
CPC ............ *H01L 33/486* (2013.01); *H01L 33/24* (2013.01); *H01L 33/405* (2013.01); *H01L 33/54* (2013.01); *H01L 33/56* (2013.01); *H01L 33/62* (2013.01); *H01L 33/641* (2013.01)

(58) Field of Classification Search
CPC ....... H01L 33/486; H01L 33/54; H01L 33/56; H01L 33/62; H01L 33/24; H01L 33/405; H01L 33/641
See application file for complete search history.

(56) References Cited

U.S. PATENT DOCUMENTS

| | | |
|---|---|---|
| 6,372,608 B1 | 4/2002 | Shimoda et al. |
| 6,645,830 B2 | 11/2003 | Shimoda et al. |
| RE38,466 E | 3/2004 | Inoue et al. |

(Continued)

FOREIGN PATENT DOCUMENTS

| | | |
|---|---|---|
| JP | 2010-087282 | 4/2010 |
| JP | 2016-066697 | 4/2016 |

*Primary Examiner* — Ismail A Muse
(74) *Attorney, Agent, or Firm* — Muir Patent Law, PLLC

(57) ABSTRACT

Provided is a light-emitting device including: a substrate; a light-emitting structure formed on the substrate; a first transmissive conductive layer on the light-emitting structure; a first dielectric pattern layer formed on the first transmissive conductive layer, the first dielectric pattern layer including a plurality of openings; a second transmissive conductive layer conformally formed on the first transmissive conductive layer exposed through the plurality of openings and on the first dielectric pattern layer; a second dielectric pattern layer filling the plurality of openings; and a reflective electrode layer formed on the second transmissive conductive layer and the second dielectric pattern layer.

20 Claims, 19 Drawing Sheets

(56) References Cited

U.S. PATENT DOCUMENTS

| | | |
|---|---|---|
| 6,818,465 B2 | 11/2004 | Biwa et al. |
| 6,818,530 B2 | 11/2004 | Shimoda et al. |
| 6,858,081 B2 | 2/2005 | Biwa et al. |
| 6,967,353 B2 | 11/2005 | Suzuki et al. |
| 7,002,182 B2 | 2/2006 | Okuyama et al. |
| 7,084,420 B2 | 8/2006 | Kim et al. |
| 7,087,932 B2 | 8/2006 | Okuyama et al. |
| 7,154,124 B2 | 12/2006 | Han et al. |
| 7,208,725 B2 | 4/2007 | Sherrer et al. |
| 7,288,758 B2 | 10/2007 | Sherrer et al. |
| 7,319,044 B2 | 1/2008 | Han et al. |
| 7,501,656 B2 | 3/2009 | Han et al. |
| 7,709,857 B2 | 5/2010 | Kim et al. |
| 7,759,140 B2 | 7/2010 | Lee et al. |
| 7,781,727 B2 | 8/2010 | Sherrer et al. |
| 7,790,482 B2 | 9/2010 | Han et al. |
| 7,940,350 B2 | 5/2011 | Jeong |
| 7,959,312 B2 | 6/2011 | Yoo et al. |
| 7,964,881 B2 | 6/2011 | Choi et al. |
| 7,985,976 B2 | 7/2011 | Choi et al. |
| 7,994,525 B2 | 8/2011 | Lee et al. |
| 8,008,683 B2 | 8/2011 | Choi et al. |
| 8,013,352 B2 | 9/2011 | Lee et al. |
| 8,049,161 B2 | 11/2011 | Sherrer et al. |
| 8,129,711 B2 | 3/2012 | Kang et al. |
| 8,179,938 B2 | 5/2012 | Kim |
| 8,263,987 B2 | 9/2012 | Choi et al. |
| 8,324,646 B2 | 12/2012 | Lee et al. |
| 8,399,944 B2 | 3/2013 | Kwak et al. |
| 8,432,511 B2 | 4/2013 | Jeong |
| 8,459,832 B2 | 6/2013 | Kim |
| 8,502,242 B2 | 8/2013 | Kim |
| 8,536,604 B2 | 9/2013 | Kwak et al. |
| 8,735,931 B2 | 5/2014 | Han et al. |
| 8,766,295 B2 | 7/2014 | Kim |
| 8,823,031 B2 | 9/2014 | Kususe et al. |
| 9,112,110 B2 | 8/2015 | Totani et al. |
| 9,178,116 B2 | 11/2015 | Hodota |
| 9,520,536 B2 | 12/2016 | Kim et al. |
| 2008/0165315 A1* | 7/2008 | Nishida .................. G02B 1/118 349/137 |
| 2011/0151607 A1* | 6/2011 | Landis ................ H01L 51/0023 438/46 |
| 2011/0220946 A1* | 9/2011 | Na .......................... H01L 33/20 257/98 |
| 2011/0254437 A1* | 10/2011 | Yamada .............. H01L 51/5265 313/504 |
| 2013/0015450 A1* | 1/2013 | Kim .................... H01L 51/5275 257/59 |
| 2017/0025571 A1 | 1/2017 | Kim et al. |
| 2017/0125494 A1* | 5/2017 | Matsusue ........... H01L 51/5044 |
| 2017/0125508 A1* | 5/2017 | Kim ....................... H01L 51/56 |
| 2017/0250314 A1* | 8/2017 | Ishiguro ............... H01L 33/387 |
| 2018/0062116 A1* | 3/2018 | Park ...................... H01L 27/322 |
| 2018/0301442 A1* | 10/2018 | Han ..................... H01L 51/5209 |
| 2018/0358580 A1* | 12/2018 | Kim .................... H01L 51/5246 |

\* cited by examiner

LIGHT-EMITTING DEVICE, PACKAGE INCLUDING THE SAME, AND METHOD OF MANUFACTURING THE SAME

CROSS-REFERENCE TO RELATED APPLICATION

This application claims the benefit of priority under 35 USC § 119 to Korean Patent Application No. 10-2017-0089168, filed on Jul. 13, 2017, in the Korean Intellectual Property Office, the disclosure of which is incorporated herein in its entirety by reference.

BACKGROUND

The inventive concept relates to a light-emitting device, a package including the same, and a method of manufacturing the same. For example, the present disclosure relates to a light-emitting device including a structure having improved light extraction efficiency, a package including the same, and a method of manufacturing the same.

The light-emitting device may include a reflective electrode layer under a light-emitting structure therein in order to improve extraction efficiency of light emitted from the light-emitting structure. Recently, as a size of the light-emitting device has gradually reduced, a light-emitting device and a package including the light-emitting device having a structure capable of increasing reflectance of a reflective electrode layer are desirable.

SUMMARY

The present disclosure provides a light-emitting device including a transmissive conductive layer and a dielectric layer having a structure capable of effectively improving light extraction efficiency.

The present disclosure provides a light-emitting device package including a transmissive conductive layer and a dielectric layer having a structure capable of effectively improving light extraction efficiency.

The present disclosure provides a method of manufacturing a light-emitting device including a transmissive conductive layer and a dielectric layer having a structure capable of effectively improving light extraction efficiency.

According to an aspect of the inventive concept, there is provided a light-emitting device including: a substrate; a light-emitting structure formed on the substrate; a first transmissive conductive layer formed on the light-emitting structure; a first dielectric pattern layer formed on the first transmissive conductive layer, the first dielectric pattern layer including a plurality of openings; a second transmissive conductive layer conformally formed on the first transmissive conductive layer exposed through the plurality of openings and on the first dielectric pattern layer; a second dielectric pattern layer filling the plurality of openings; and a reflective electrode layer formed on the second transmissive conductive layer and the second dielectric pattern layer.

According to another aspect of the inventive concept, there is provided a light-emitting device package including: a substrate; a plurality of light-emitting structures formed on the substrate, each of the light-emitting structures comprising a first conductive semiconductor layer, an active layer, and a second conductive semiconductor layer; a first transmissive conductive layer formed on the second conductive semiconductor layer; a first dielectric pattern layer formed on the first transmissive conductive layer, the first dielectric pattern layer including a plurality of openings; a second transmissive conductive layer conformally formed on the first transmissive conductive layer exposed through the plurality of openings and on the first dielectric pattern layer; a second dielectric pattern layer filling the plurality of openings; a first electrode layer and a first external connection terminal, each electrically connected to the first conductive semiconductor layer; a second electrode layer and a second external connection terminal, each electrically connected to the second conductive semiconductor layer, the second electrode layer being formed on the second transmissive conductive layer and on the second dielectric pattern layer; and a module mounting the substrate and electrically connected to the first and second external connection terminals.

According to another aspect of the inventive concept, there is provided a light-emitting device including: a substrate; a light-emitting structure on the substrate; a transmissive conductive layer formed on the light-emitting structure and including an internal space; a first dielectric pattern layer trapped in the internal space; a second dielectric pattern layer which is not trapped in the internal space and includes a top surface located substantially at a same level as a top surface of the transmissive conductive layer; and a reflective electrode layer on the transmissive conductive layer and the second dielectric pattern layer.

BRIEF DESCRIPTION OF THE DRAWINGS

Embodiments of the inventive concept will be more clearly understood from the following detailed description taken in conjunction with the accompanying drawings in which.

DETAILED DESCRIPTION

Hereinafter, embodiments of the inventive concept will be described in detail with reference to the accompanying drawings.

Figure 1:
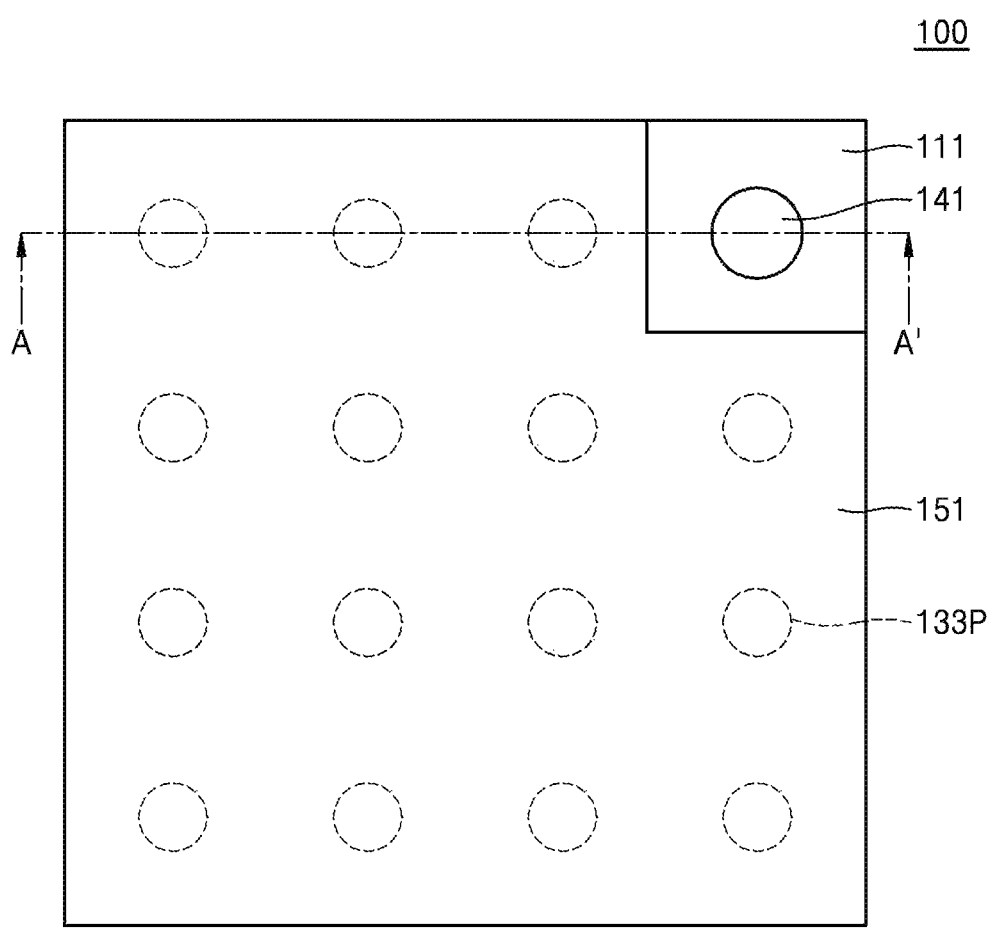
FIGS. 1 and 2 are respectively a plan view and a cross-sectional view illustrating a light-emitting device according to an embodiment of the inventive concept.
Figure 2:
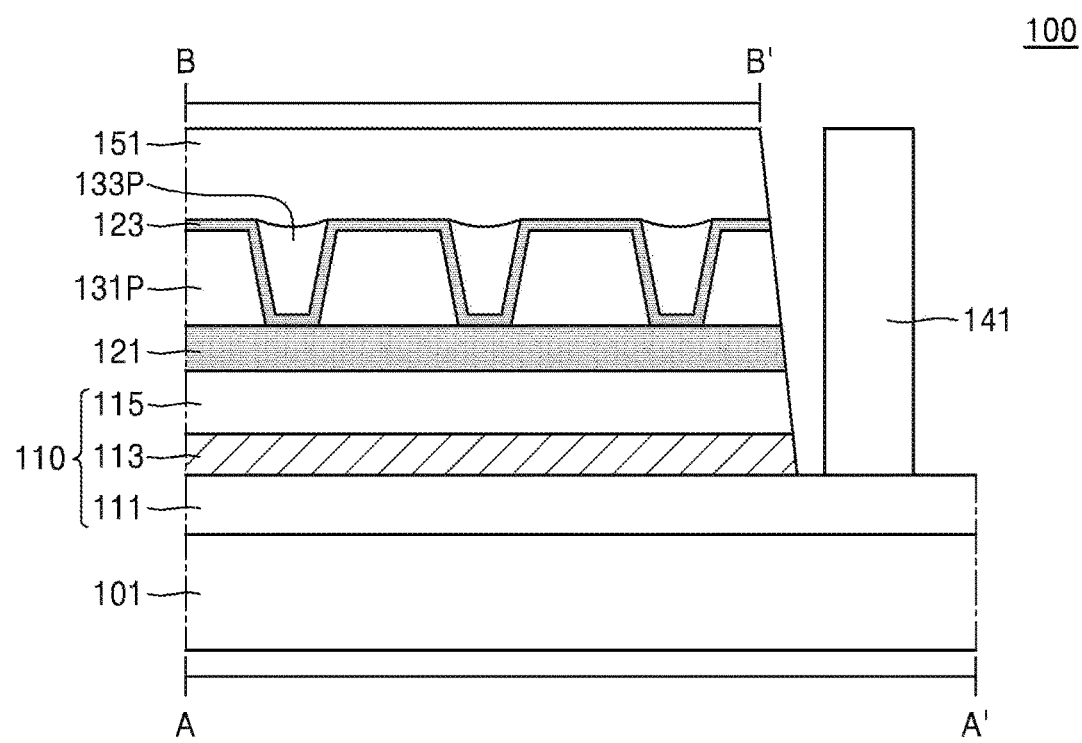

FIGS. 1 and 2 are respectively a plan view and a cross-sectional view illustrating a light-emitting device according to an embodiment of the inventive concept.

FIG. 1 is a plan view of a light-emitting device 100 according to an embodiment of the inventive concept, and FIG. 2 is a cross-sectional view of the light-emitting device 100 taken along line A-A' in FIG. 1. In FIG. 1, a second electrode layer 151, which will be described later, may be transparent, and a shape or boundary of a second dielectric pattern layer 133P under the second electrode layer 151 is illustrated by a dashed line.

The light-emitting device 100 may include the following components.

The light-emitting device 100 may include a light-emitting structure 110 formed on a substrate 101 and including a first conductive semiconductor layer 111, an active layer 113, and a second conductive semiconductor layer 115. In some embodiments, the first conductive semiconductor layer 111 may include an n-type semiconductor material and the second conductive semiconductor layer 115 may include a p-type semiconductor material. For example, the first conductive semiconductor layer 1 may be an n-type semiconductor layer and the second conductive semiconductor layer 114 may be a p-type semiconductor layer.

The light-emitting device 100 may include a first transmissive conductive layer 121 on the second conductive semiconductor layer 115 and a first dielectric pattern layer 131P formed on the first transmissive conductive layer 121. The first dielectric pattern layer 131P may include a plurality of openings.

The light-emitting device 100 may include a second transmissive conductive layer 123 conformally formed on the first dielectric pattern layer 131P and on the first transmissive conductive layer 121 exposed through the plurality of openings. For example, the second transmissive conductive layer 123 may have a plurality of prominences and depressions conforming to morphology of the first dielectric pattern layer 131P including the plurality of openings. A second dielectric pattern layer 133P may be formed to fill the plurality of openings. For example, the second dielectric pattern layer 133P may include a plurality of circular shapes arranged at regular intervals in a plan view as shown in FIG. 1.

The light-emitting device 100 may include a second electrode layer 151 formed on the second transmissive conductive layer 123 and the second dielectric pattern layer 133P. The second electrode layer 151 may be electrically connected to the second conductive semiconductor layer 115. The light-emitting device 100 may include a first electrode layer 141 electrically connected to the first conductive semiconductor layer 111. In some embodiments, the second electrode layer 151 may be a reflective electrode layer.

In an exemplary embodiment of a light-emitting device, a reflective electrode layer may include a reflective metal having high reflectance characteristics. A dielectric layer may be inserted between a p-type semiconductor layer and the reflective electrode layer, and a total reflection effect may be obtained due to different refractive indices between the p-type semiconductor layer and the dielectric layer. For example, the dielectric layer inserted between the p-type semiconductor layer and the reflective electrode layer may have a lower refractive index than the refractive index of the p-type semiconductor layer. The p-type semiconductor layer may include a multiple quantum well (MQW) structure. By a total reflection, the light emitted from the light-emitting structure may be effectively reflected toward a substrate disposed opposite to the reflective electrode layer with respect to a light emitting structure. In certain embodiments, reflectance may be further improved by optimizing a thickness of the dielectric layer.

In certain embodiments, a current channel may be formed between the p-type semiconductor layer and the reflective electrode layer for electrical signal application between the p-type semiconductor layer and the reflective electrode layer. For example, a portion of the dielectric layer may be removed for electrical connection between the reflective electrode layer and the p-type semiconductor layer. In this case, in a region where the dielectric layer is removed, the p-type semiconductor layer may contact the reflective electrode layer. The term "contact" as used herein refers to a direct connection, i.e., touching.

The light-emitting device 100 according to certain embodiments of the inventive concept may include a plurality of transmissive conductive layers and a plurality of dielectric layers which may replace regions where reflective electrode layers are formed as channels for applying current, so that reflectance may increase via total reflection in all regions, and consequently, light output efficiency may be improved.

The light-emitting device 100 according to an embodiment of the inventive concept may not substantially have a region in which the second electrode layer 151 contacts the first transmissive conductive layer 121. When all portions of the first transmissive conductive layer 121 are covered by the first and/or the second dielectric pattern layers 131P and 133P, a high reflectance may be obtained via the total reflection. For example, the refractive indices of the first and second dielectric pattern layers 131P and 133P may be lower than the refractive indices of the first and second transmissive conductive layers 121 and 123 and/or the second conductive semiconductor layer 115. For example, the first and second dielectric pattern layers 131P and 133P may have the same refractive indices.

A method of manufacturing the light-emitting device 100 including such a reflective structure will be described in detail with reference to FIGS. 4A through 4H. In addition, details of reflectance improvement via the total reflection will be described in detail with reference to FIG. 5, and reflectance of the light-emitting devices including different reflective structures from each other will be described in detail with reference to FIG. 6.

Figure 3:
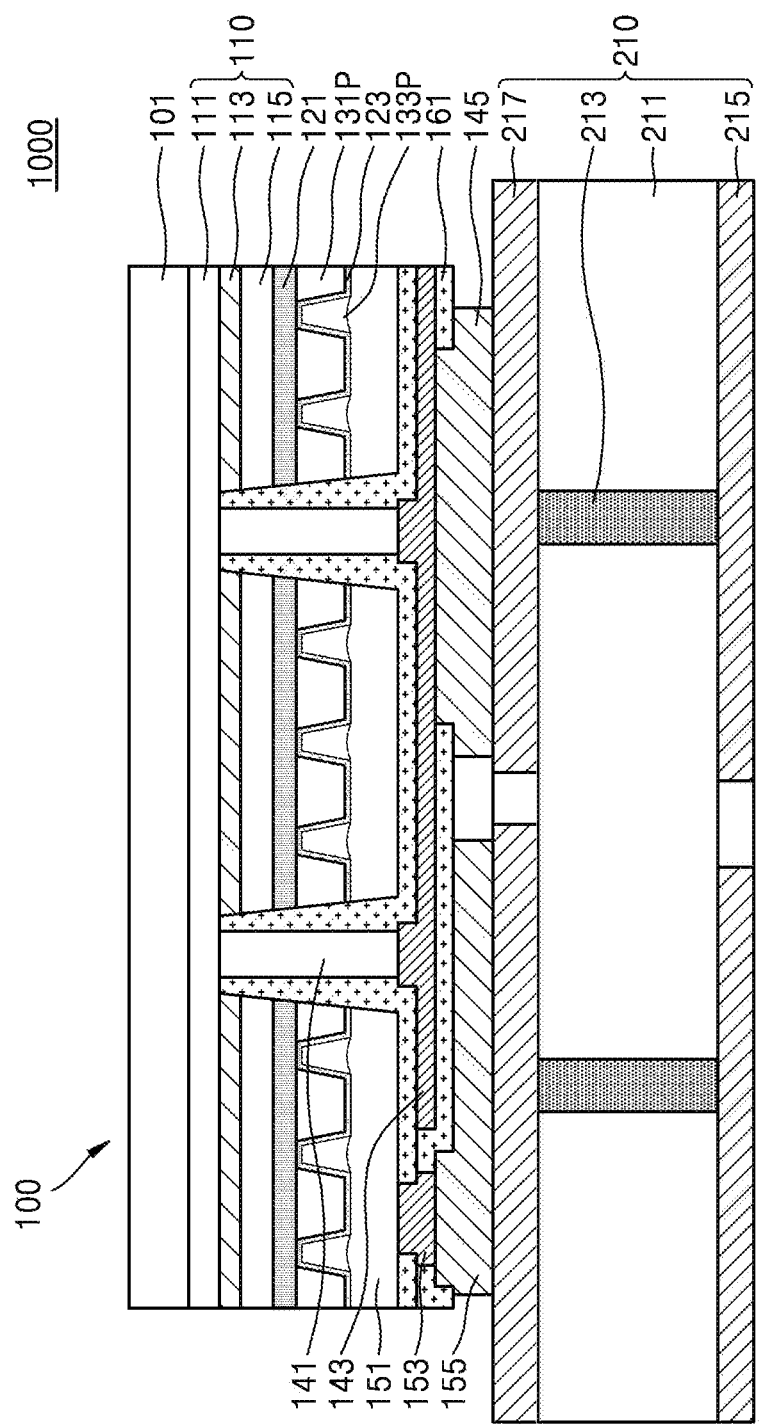
FIG. 3 is a cross-sectional view illustrating a light-emitting device package according to an embodiment of the inventive concept.

FIG. 3 is a cross-sectional view illustrating a light-emitting device package 1000 according to an embodiment of the inventive concept.

Referring to FIG. 3, the light-emitting device package 1000 is illustrated in which a light-emitting device 100 is electrically connected to a module 210 via a first external connection terminal 145 and a second external connection terminal 155, and is mounted over the module 210.

The light-emitting device 100 may include the light-emitting structure 110 on one side of the substrate 101, and a first electrical connection unit 143 and a second electrical connection unit 153 on an opposite side of the light-emitting structure 110 with respect to the one side where the substrate 101 is disposed.

The light-emitting device 100 may include an insulating unit 161 formed to cover a portion of the first electrical connection unit 143 and the second electrical connection unit 153. The first electrode layer 141 and the second electrode layer 151 may be electrically connected to the first external connection terminal 145 and the second external connection terminal 155 by the first electrical connection unit 143 and the second electrical connection unit 153, respectively.

The first electrode layer 141 and the second electrode layer 151 may include various materials and/or various structures in order to improve ohmic characteristics and/or reflection characteristics.

The insulating unit 161 may include an open region to expose at least a portion of the first electrical connection unit 143 and the second electrical connection unit 153. The first external connection terminal 145 and the second external connection terminal 155 may contact the first electrical connection unit 143 and the second electrical connection unit 153, respectively. For example, the insulating unit 161 may have open areas through which the first and second external connection terminals 145 and 155 respectively contact the first and second electrical connection units 143 and 153. The insulating unit 161 may include silicon oxide, silicon nitride, or silicon oxynitride.

The light-emitting device 100 may be mounted over the module 210 such as a lead frame and a printed circuit board in a flip-chip structure. In this case, the first external connection terminal 145 and the second external connection terminal 155 may be arranged to face the same direction. For example, the first and second external connection terminals 145 and 155 may be disposed on the bottom of the light-emitting device 100 as shown in FIG. 3.

In some embodiments, the light-emitting device 100 may include a plurality of mutually-separated light-emitting structures 110 on one side of the substrate 101. By forming the plurality of mutually-separated light-emitting structures 110 on the substrate 101, paths of light emitted from the active layer 113 may be diverse, so that a rate of light absorption within the semiconductor layer may be reduced, a rate of light scattering may increase, and the light extraction efficiency may be improved.

The first external connection terminal 145 and the second external connection terminal 155 may be respectively connected to the first electrical connection unit 143 and the second electrical connection unit 153 to serve as external terminals of the light-emitting device 100. The first external connection terminal 145 and the second external connection terminal 155 may include, for example, gold (Au), silver (Ag), aluminum (Al), titanium (Ti), tungsten (W), copper (Cu), tin (Sn), nickel (Ni), platinum (Pt), chromium (Cr), and a eutectic metal thereof. In this case, when the light-emitting device 100 is mounted over the module 210 by bonding with the eutectic metal, a separate solder bump may not be used for a flip-chip bonding. There may be an advantage because a heat radiation effect may be better in a mounting method using the eutectic metal than a mounting method using the solder bump. In this case, the first external connection terminal 145 and the second external connection terminal 155 may be formed to occupy a wide area in order to obtain a better heat radiation effect. For example, the first and/or second external connection terminals 145 and/or 155 may be wider than an active pattern 113 of a corresponding light emitting structure 110 in a cross-sectional view crossing a center of the active pattern as shown in FIG. 3. In certain embodiments, the first and/or second external connection terminals 145 and/or 155 may have a wider area than an active pattern 113 of a corresponding light emitting structure 110 in a plan view.

The module 210 may include a top electrode layer 217 and a bottom electrode layer 215 on a top surface and a bottom surface thereof, respectively, and a via hole 213 penetrating a body unit 211 for connecting the top electrode layer 217 and the bottom electrode layer 215. The body unit 211 may include an insulating material such as resin and ceramic, and the top electrode layer 217 and the bottom electrode layer 215 may include a metal, such as Au, Ag, Al, and Cu.

However, the module 210 is not limited thereto and any type of module may be applied as long as a wiring structure for driving the light-emitting device 100 is formed. For example, the light-emitting device 100 may be provided in a structure where the light-emitting device 100 is mounted on a lead frame.

The light-emitting device package 1000 according to an embodiment of the inventive concept may include a plurality of transmissive conductive layers and a plurality of dielectric layers which may replace regions where reflective electrode layers are formed as channels for applying current, so that reflectance may increase via total reflection in all regions, and consequently, light output efficiency may be improved. In certain embodiments, a reflective electrode layer may be formed in addition to the plurality of transmissive conductive layers and the plurality of dielectric layers to improve light output efficiency of a light emitting device. For example, as shown in FIG. 2, an area of contact between the second transmissive conductive layer 123 and the reflective electrode layer 151 is greater than an area of contact between the second transmissive conductive layer 123 and the first transmissive conductive layer 121.

The light-emitting device 100 included in the light-emitting device package 1000 according to an embodiment of the inventive concept may not substantially include a region in which the second electrode layer 151 and the first transmissive conductive layer 121 contact each other, and when an entire region of the first transmissive conductive layer 121 is covered with the first and/or the second dielectric pattern layers 131P and 133P, a high reflectance may be obtained via total reflection.

FIGS. 4A through 4H are cross-sectional views illustrating a method of manufacturing a light-emitting device according to an embodiment of the inventive concept.

FIGS. 4A through 4H are cross-sectional views corresponding to line B-B' in FIG. 2. As described above with reference to FIG. 2, the light-emitting device 100 according to an embodiment of the inventive concept provides a configuration in which the first and second transmissive conductive layers 121 and 123, and the first and second dielectric pattern layers 131P and 133P are formed on the second conductive semiconductor layer 115, this configuration will be described below. A process of forming the first electrode layer 141 on the first conductive semiconductor layer 111 may be similar to a process of manufacturing a general light-emitting device, and thus, a detailed description thereof will be omitted here.

Figure 4A:
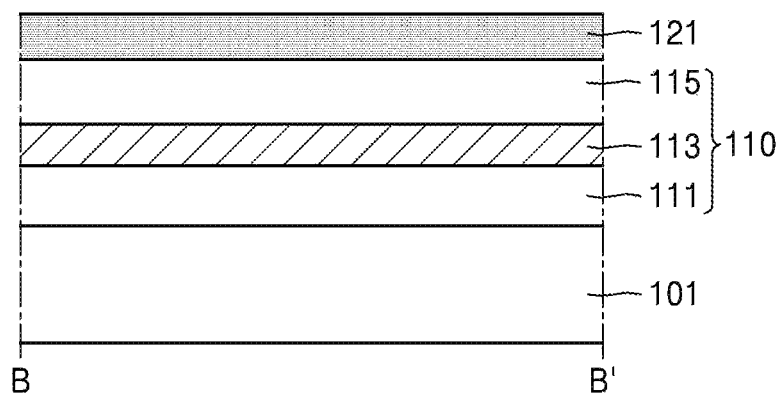
FIGS. 4A through 4H are cross-sectional views illustrating steps of a method of manufacturing a light-emitting device, according to an embodiment of the inventive concept.

Referring to FIG. 4A, the light-emitting structure 110 may be formed on the substrate 101 and the first transmissive conductive layer 121 may be formed on the light-emitting structure 110.

The substrate 101 may be arranged under the light-emitting structure 110 to support the light-emitting structure 110. The substrate 101 may receive heat generated from the light-emitting structure 110 through a base layer (not illustrated) and may discharge the received heat to the outside. For example, the substrate 101 may have optical transparency. The substrate 101 may include a light-transmissive material or may include a material having a light transmittance when a thickness thereof is equal to or less than a certain thickness. For example, light coming from the light-emitting structure 110 may go through the substrate 101.

The substrate 101 may be an insulating, conductive, or semiconductor substrate, as needed. For example, the substrate 101 may include one of sapphire ($Al_2O_3$), gallium nitride (GaN), silicon (Si), germanium (Ge), gallium arsenide (GaAs), zinc oxide (ZnO), Silicon carbide (SiC), gallium oxide ($Ga_2O_3$), lithium gallium oxide ($LiGaO_2$), lithium aluminum oxide ($LiAlO_2$), and magnesium aluminum oxide ($MgAl_2O_4$).

In some embodiments, sapphire, silicon carbide, silicon substrate, and the like may be mainly used for the substrate 101, and sapphire or silicon substrates, which are relatively inexpensive compared to silicon carbide substrates, may be used more. For example, the substrate 101 may include one or more materials described above.

The substrate 101 may be completely or partially removed during the manufacturing process of the light-emitting device 100 to improve optical characteristics or electrical characteristics before or after formation of the light-emitting structure 110. In case of the sapphire substrate, the substrate 101 may be removed by irradiating an interface between the substrate 101 and the base layer with laser via the substrate 101. In cases of the silicon substrate and the silicon carbide substrate, the substrate 101 may be removed by polishing or etching.

The base layer may be formed for a purpose of providing a growth surface of the light-emitting structure 110. For example, the base layer may include $In_xAl_yGa_{(1-x-y)}$ ($0 \le x \le 1$, $0 \le y \le 1$), GaN, AlN, AlGaN, InGaN, or InGaNAlN, and may include $ZrB_2$, $HfB_2$, ZrN, HfN, TiN, and the like, as needed. The base layer may be formed in a multilayer structure or may be formed by gradually changing a composition in the multilayer structure. In some embodiments, the base layer may be omitted.

The light-emitting structure 110 may include the first conductive semiconductor layer 111, the active layer 113, and the second conductive semiconductor layer 115. Each of the first conductive semiconductor layer 111 and the second conductive semiconductor layer 115 may have a single-layer structure or may have a multi-layer structure having different compositions therein as needed. For example, each of the first conductive semiconductor layer 111 and the second conductive semiconductor layer 115 may include a carrier injection layer capable of improving an injection efficiency of electrons and/or holes, and may include various types of super-lattice structures.

The first conductive semiconductor layer 111 may include a current diffusion layer (not illustrated) at a portion adjacent to the active layer 113. The current diffusion layer may have a partially formed structure in which a plurality of $In_xAl_yGa_{(1-x-y)}N$ layers having different compositions or different impurities are repeatedly laminated, or the current diffusion layer may have a partially formed insulating material layer.

The second conductive semiconductor layer 115 may include an electron blocking layer (not illustrated) at a portion adjacent to the active layer 113. The electron blocking layer may have a structure in which a plurality of different compositions of $In_xAl_yGa_{(1-x-y)}N$ are stacked or a material layer composed of $Al_yGa_{(1-y)}N$, and a band gap thereof may be greater than that of the active layer 113 such that electrons may be prevented from being transferred to the second conductive semiconductor layer 115.

As a method of manufacturing the light-emitting structure 110, an organometallic compound gas such as trimethylgallium (TMG) and trimethylaluminum (TMA), and a nitrogen-containing gas, for example, ammonia gas may be supplied as reactant gases into a reacting container having the substrate 101 therein, and temperature of the substrate 101 may be maintained at about 900° C. to about 1100° C. A gallium nitride compound semiconductor may grow on the substrate 101. The gallium nitride compound semiconductor may be laminated in an un-doped type, the n-type, or the p-type depending on impurity gases supplied during the growth process.

The active layer 113 arranged between the first conductive semiconductor layer 111 and the second conductive semiconductor layer 115 may include a multiple quantum well (MQW) structure in which quantum well layers and quantum barrier layers are alternatively laminated, for example, multiple GaN/InGaN structures in case of the nitride semiconductor, or alternatively, may include a single quantum well (SQW) structure.

The first transmissive conductive layer 121 may be formed on the second conductive semiconductor layer 115. The first transmissive conductive layer 121 may be formed substantially in an entire region of the second conductive semiconductor layer 115 so that current may be uniformly provided to the entire region of the second conductive semiconductor layer 115.

The first transmissive conductive layer 121 may include an oxide including, for example, Zn, In, Sn, and the like. For example, the first transmissive conductive layer 121 may be indium tin oxide (ITO), ZnO, $In_2O_3$, $SnO_2$, and the like.

For example, thickness of the first transmissive conductive layer 121 may be determined in consideration of light absorbance and electric resistance/sheet resistance, and the like. It may be beneficial for raising light extraction efficiency that the thickness of the first transmissive conductive layer 121 is approximately an integer multiple of $\lambda/4$ with respect to the wavelength $\lambda$ of light emitted from the light-emitting structure 110.

Figure 4B:
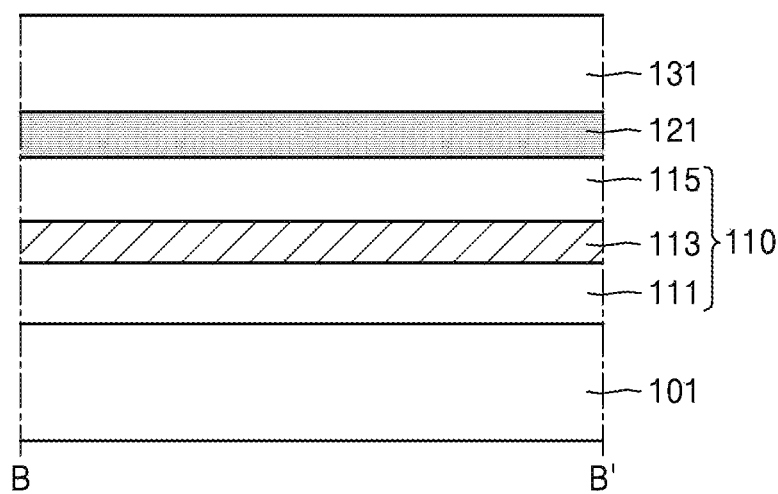

Referring to FIG. 4B, the first dielectric layer 131 may be formed on the first transmissive conductive layer 121.

The first dielectric layer 131 may be formed in a single layer or a multilayer structure by alternately stacking two different dielectric layers having different refractive indices on the first transmissive conductive layer 121. In certain embodiments, the multilayer structure may be formed by stacking three or more different layers. For example, the first dielectric layer 131 may be a single layer including one of SiO2, MgF2, SiN, TiO2, and Nb2O5, or may have a multilayer structure formed by alternately stacking two different layers respectively formed with the example materials forming the single layers. In certain embodiments, the first dielectric layer 131 may have a multilayer structure formed by three or more layers respectively formed with the example materials forming the single layers.

The total thickness of the first dielectric layer 131 may be about 0.2 μm to about 1 μm. The first dielectric layer 131 may be formed with a material having a refractive index less than that of the second conductive semiconductor layer 115.

The second conductive semiconductor layer 115 may be a p-type gallium nitride (GaN) semiconductor layer and in this case, the refractive index may be approximately about 2.45. For example, the refractive index may vary depending on a thickness of the second conductive semiconductor layer 115, and the thickness of the second conductive semiconductor layer 115 may be formed to have a refractive index about 2.45. The first dielectric layer 131 may be a silicon oxide layer and in this case, the approximate refractive index thereof may be approximately about 1.46. For example, when the refractive index of the first dielectric layer 131 is less than that of the second conductive semiconductor layer 115, a total reflection may occur depending on an angle of incidence of light emitted from the light-emitting structure 110 and incident on the first dielectric layer 131. For example, the total reflection may occur at a boundary between the second conductive semiconductor layer 115 and the first dielectric layer 131.

Figure 4C:
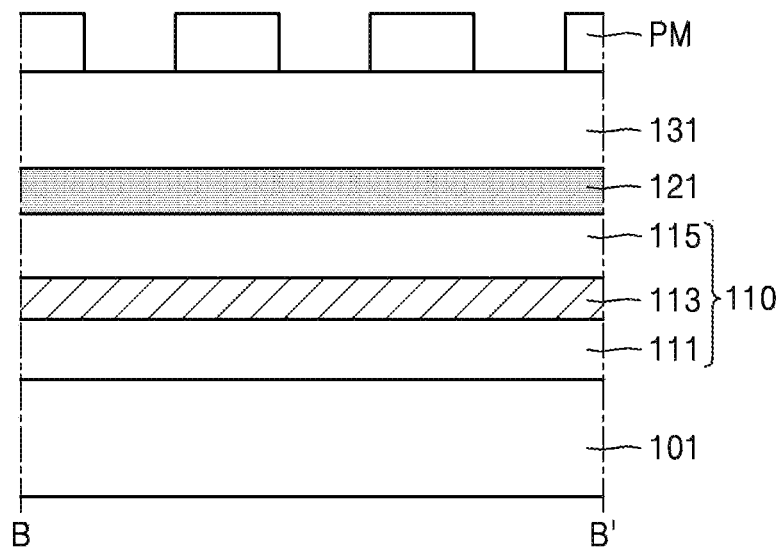

Referring to FIG. 4C, a photomask pattern PM may be formed on the first dielectric layer 131.

After photoresist is coated on the first dielectric layer 131, the photoresist may be exposed and developed. Then, as illustrated in FIG. 4C, only a portion of the photoresist may remain and the other portion of photoresist may be removed to form the photomask pattern PM.

The photomask pattern PM may be a pattern arranged with a certain rule or a pattern arranged irregularly. For example, the photomask pattern PM may be arranged regularly. Thicknesses and widths of the photomask pattern PM may be adjusted in a later process to affect a shape of the opening 131G (refer to FIG. 4D) included in the first dielectric pattern layer 131P (refer to FIG. 4D). For example, the photomask pattern PM may be modified in a later step to have a shape of an etch mask for etching the first dielectric layer 131.

Figure 4D:
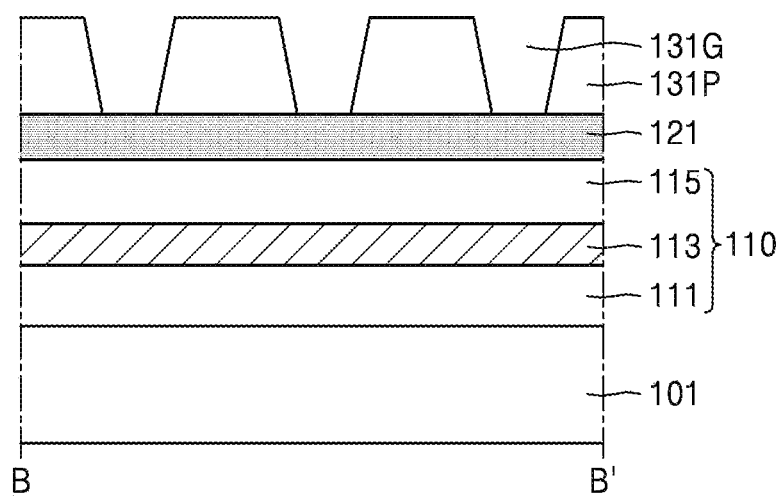

Referring to FIG. 4D, a portion of the first dielectric layer 131 (refer to FIG. 4C) may be etched by using the photomask pattern PM (refer to FIG. 4C) as an etching mask and the photomask pattern PM may be removed by ashing and stripping processes.

The etching process may be a dry etching process. The first dielectric pattern layer 131P including a plurality of openings 131G may be formed via the dry etching. Due to characteristics of the etching process of certain embodiments, the openings 131G may have sloped or tapered sidewalls. For example, the sidewalls of the openings 131G may not be vertical but be sloped. For example, the openings 131G become narrower as they go down. For example, the openings 131G may have trapezoid shapes respectively having shorter lower bases than upper bases in a cross-sectional view. For example, the first dielectric pattern layer 131P may have a trapezoid shape having a shorter upper base that a lower base between two openings 131G in a cross-sectional view. For example, the openings 131G and the first dielectric pattern layer 131P may respectively have isosceles trapezoid shapes in a cross-sectional view. For example, the openings 131G may have inverted trapezoidal cross-sectional shapes and the first dielectric pattern layer 131P may have an orthogonal trapezoidal cross-sectional shape in certain embodiments.

In certain embodiments, an opening 131G may have substantially vertical sidewalls. In this case, the opening 131G and the first dielectric pattern layer 131P may each have a rectangular shape, e.g., in a cross-sectional view.

Each of the openings 131G may partially expose the first transmissive conductive layer 121. For example, when an exposed portion of the first transmissive conductive layer 121 is viewed from a top surface of the first transmissive conductive layer 121, it may be circular. For example, each of the exposed portions may have a circular shape in a plan view. For example, the first dielectric pattern layer 131P may include a plurality of openings 131G which are columnar.

Figure 4E:
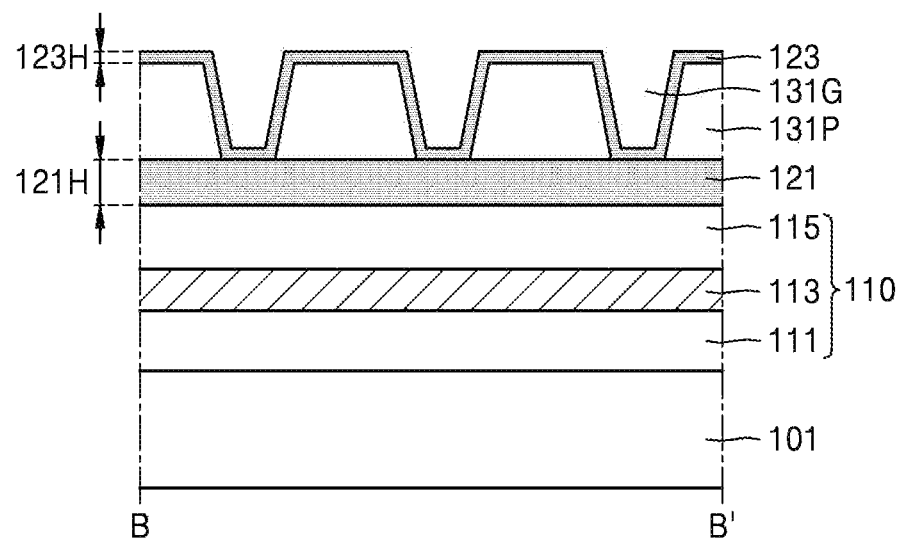

Referring to FIG. 4E, the second transmissive conductive layer 123 may be conformally formed on side surfaces and top surfaces of the first dielectric pattern layer 131P and top surfaces of the first transmissive conductive layer 121 which are exposed through the plurality of openings 131G.

When the second transmissive conductive layer 123 is formed so as to cover the first transmissive conductive layer 121 exposed through the plurality of openings 131G, the second transmissive conductive layer 123 may be electrically connected to the first transmissive conductive layer 121. The second transmissive conductive layer 123 may be formed to have a wide contact area with the first transmissive conductive layer 121 to inject/provide a uniform current into the light-emitting structure 110.

Like the first transmissive conductive layer 121 described above, the second transmissive conductive layer 123 may include an oxide including, for example, Zn, In, Sn, and the like. The second transmissive conductive layer 123 may include ITO, ZnO, $In_2O_3$, $SnO_2$, and the like.

For example, materials constituting the first transmissive conductive layer 121 and the second transmissive conductive layer 123 may be the same. However, embodiments are not limited thereto, and the first and second transmissive conductive layers 121 and 123 may include different materials from each other.

From another point of view, when materials constituting the first transmissive conductive layer 121 and the second transmissive conductive layer 123 are the same, both the first transmissive conductive layer 121 and the second transmissive conductive layer 123 may be considered as one component, and may be referred to as a transmissive conductive layer having an internal space. In this case, the first dielectric pattern layer 131P may be trapped in the internal space.

In certain embodiments, a thickness 121H of the first transmissive conductive layer 121 may be greater than a thickness 123H of the second transmissive conductive layer 123. It may be beneficial to increase the thickness 123H of the second transmissive conductive layer 123 in order to improve conductive characteristics. However, when the material constituting the second transmissive conductive layer 123, for example, ITO, has an absorbing property, it may be beneficial to form the thickness 123H to have a proper thickness in order to improve luminous efficiency. For example, reducing light absorption is beneficial to improve the light extraction efficiency of a light emitting device, and the thickness 121H of the first transmissive conductive layer 121 and the thickness 123H of the second transmissive conductive layer 123 may each be formed to be equal to or less than about 100 nm, e.g., to improve light extraction efficiency. When the thickness is greater than about 100 nm, a greater loss may occur in an entire region of the light-emitting device 100. For example, the light extraction efficiency and the conductivity may be in a trade-off relationship with respect to the thicknesses 121H and 123H of the transmissive conductive layers 121 and 123. For example, when the thicknesses of transmissive conductive layers 121 and 123 increase, the conductive characteristics is improved and the light extraction efficiency is lowered due to the absorbed light.

Figure 4F:
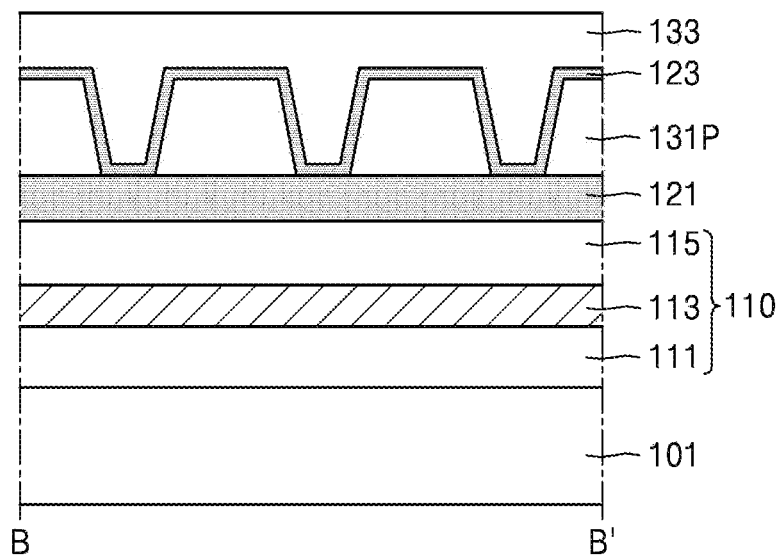

Referring to FIG. 4F, the second dielectric layer 133 may be formed so as to completely fill the opening 131G (refer to FIG. 4E) and cover a top surface of the second transmissive conductive layer 123.

The second dielectric layer 133 may be formed on the second transparent conductive layer 123 as a single layer or a multilayer structure by alternately stacking two different dielectric layers having different refractive indexes. In certain embodiments, the multilayer structure may be formed by stacking three or more different layers. For example, the second dielectric layer 133 may be a single layer including one of $SiO_2$, $MgF_2$, SiN, $TiO_2$, and $Nb_2O_5$, or may have a multilayer structure formed by alternately stacking two different layers respectively formed with the example materials forming the single layers. In certain embodiments, the second dielectric layer 133 may have a multilayer structure formed by three or more layers respectively formed with the example materials forming the single layers.

The second dielectric layer 133 may include the same material as the first dielectric layer 131 (refer to FIG. 4B). Alternatively, the second dielectric layer 133 may include a different material from the first dielectric layer 131.

The total thickness of the second dielectric layer 133 may be about 0.2 μm to about 1 μm. The refractive index of the second dielectric layer 133 may be adjusted to be less than that of the second conductive semiconductor layer 115. This is similar to content of a comparison described above about the refractive index of the first dielectric layer 131.

For example, when the refractive index of the second dielectric layer 133 is less than that of the second conductive semiconductor layer 115, a total reflection may occur depending on an angle of incidence of light emitted from the light-emitting structure 110 incident on the second dielectric layer 133. For example, above described structure may allow a total internal reflection at a boundary between the second conductive semiconductor layer 115 and the second dielectric layer 133 for the light emitted from the light-emitting structure 110 with an incident angle higher than a critical angle.

Figure 4G:
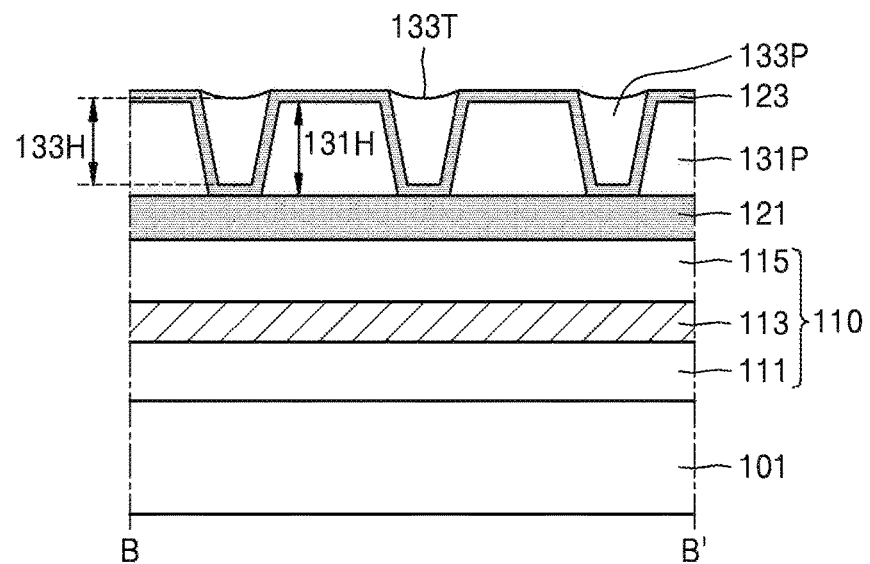

Referring to FIG. 4G, the second dielectric pattern layer 133P may be formed by removing an unnecessary portion of the second dielectric layer by using an etch-back process or a polishing process so that the second dielectric layer 133 (refer to FIG. 4F) remains only in the opening 131G.

In the etch-back process or the polishing process, the second transmissive conductive layer 123 may serve as an etch stop layer. For example, the etch-back process or the polishing process may be performed until an uppermost surface of the second transmissive conductive layer 123 is completely exposed. In this case, the second dielectric layer may be over-etched. For example, as shown in FIG. 4G, a center portion of the top surface 133T of the second dielectric pattern layer 133P may be lower than the top surface of the second transmissive conductive layer 123 formed on a top surface of the first dielectric pattern layer 131P.

For example, the thickness 133H of the second dielectric pattern layer 133P may be less than the thickness 131H of the first dielectric pattern layer 131P, when the thickness of the second transmissive conductive layer 123 is the same regardless of a formation location thereof. For example, the center portion thickness 133H of the second dielectric pattern layer 133P may be less than the thickness 131H of the first dielectric pattern layer 131P.

In other embodiments, the thickness 133H of the second dielectric pattern layer 133P may be substantially the same as the thickness 131H of the first dielectric pattern layer 131P, when the second dielectric pattern layer 133P is not over-etched. For example, the uppermost surface of the second transmissive conductive layer 123 and the top surface 133T of the second dielectric pattern layer 133P may be arranged coplanar with each other. Terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to emphasize this meaning, unless the context or other statements indicate otherwise. For example, items described as "substantially the same," "substantially equal," or "substantially planar," may be exactly the same, equal, or planar, or may be the same, equal, or planar within acceptable variations that may occur, for example, due to manufacturing processes.

When the second dielectric pattern layer 133P fills the opening 131G, the second dielectric pattern layer 133P may have an inverted trapezoidal cross-sectional shape like the opening 131G. For example, the second dielectric pattern layer 133P may be a trapezoid cross-sectional view having an upper base greater than its lower base. For example, the first dielectric pattern layer 131P may have a trapezoidal cross-sectional shape having a lower base greater than its upper base. For example, one or both of the first and the second dielectric pattern layers 131P and 133P may have isosceles trapezoids in a cross-sectional view.

In FIG. 4G, it is illustrated that widths of the respective trapezoidal cross-sectional shapes of the first dielectric pattern layer 131P are greater than those of the respective inverted trapezoidal cross-sectional shapes of the second dielectric pattern layer 133P. However, embodiments are not limited thereto.

When all region of the first transmissive conductive layer 121 is covered with the first dielectric pattern layer 131P and the second dielectric pattern layer 133P, light emitted in the vertical direction from the light-emitting device 100 may pass through at least one of the first dielectric pattern layer 131P and the second dielectric pattern layer 133P.

In this manner, it may be possible to limit or prevent the reduction in total reflection efficiency which occurs in a structure formed by removing a portion of a dielectric layer and filling a conductor material in the portion where the dielectric layer is removed so as to apply current through the conductor material into a light-emitting structure of a light-emitting device. For example, even if a portion of the first dielectric layer 131 (refer to FIG. 4B) is removed, the removed portion may be filled with the second dielectric pattern layer 133P. Accordingly, high reflectance may be obtained through a total reflection, because the first and/or second dielectric pattern layers 131P and 133P are formed to cover all regions of the first transmissive conductive layer 121.

The second transmissive conductive layer 123 may be used as an electrical path for applying current into the light-emitting structure 110.

Figure 4H:
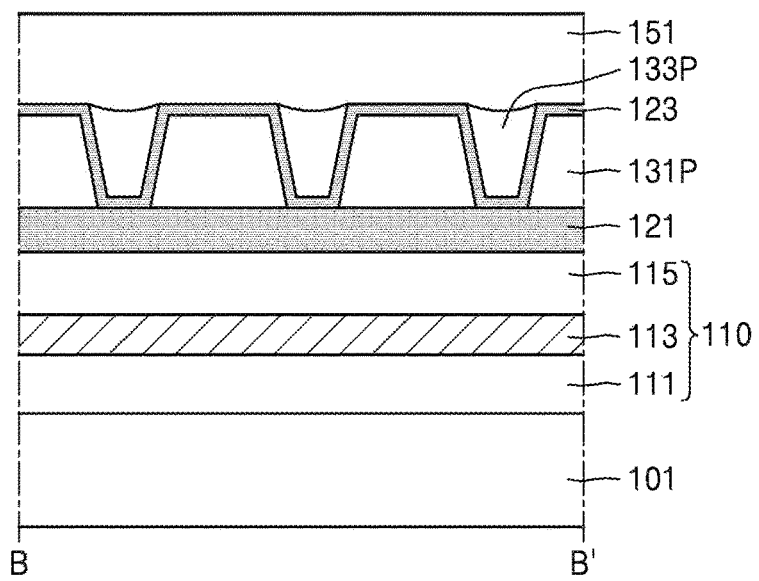

Referring to FIG. 4H, the second electrode layer 151 may be formed on the second transmissive conductive layer 123 and the second dielectric pattern layer 133P.

The second electrode layer 151 may be electrically connected to the second conductive semiconductor layer 115 constituting the light-emitting structure 110 through the second transmissive conductive layer 123 and the first transmissive conductive layer 121 in sequence.

The second electrode layer 151 may be a reflective electrode layer as described above, and the second electrode layer 151 may reflect light emitted from the light-emitting structure 110 toward the substrate 101 and may transmit electrical signals to the light emitting structure 110 as a conductive layer. The light-emitting device 100 may improve the light extraction efficiency and the reliability with such reflection function.

The second electrode layer 151 may include, for example, silver (Ag), aluminum (Al), titanium (Ti), tungsten (W), copper (Cu), tin (Sn), chromium (Cr), or an alloy of Ag.

Here, processes of forming up to the second electrode layer 151 have been described, and a process of forming the first electrode layer 141 (refer to FIG. 2) may be performed after forming the second electrode layer 151. The process of forming the first electrode layer 141 may be performed by one of ordinary skill in the art based on the contents described in the present specification.

Figure 5:
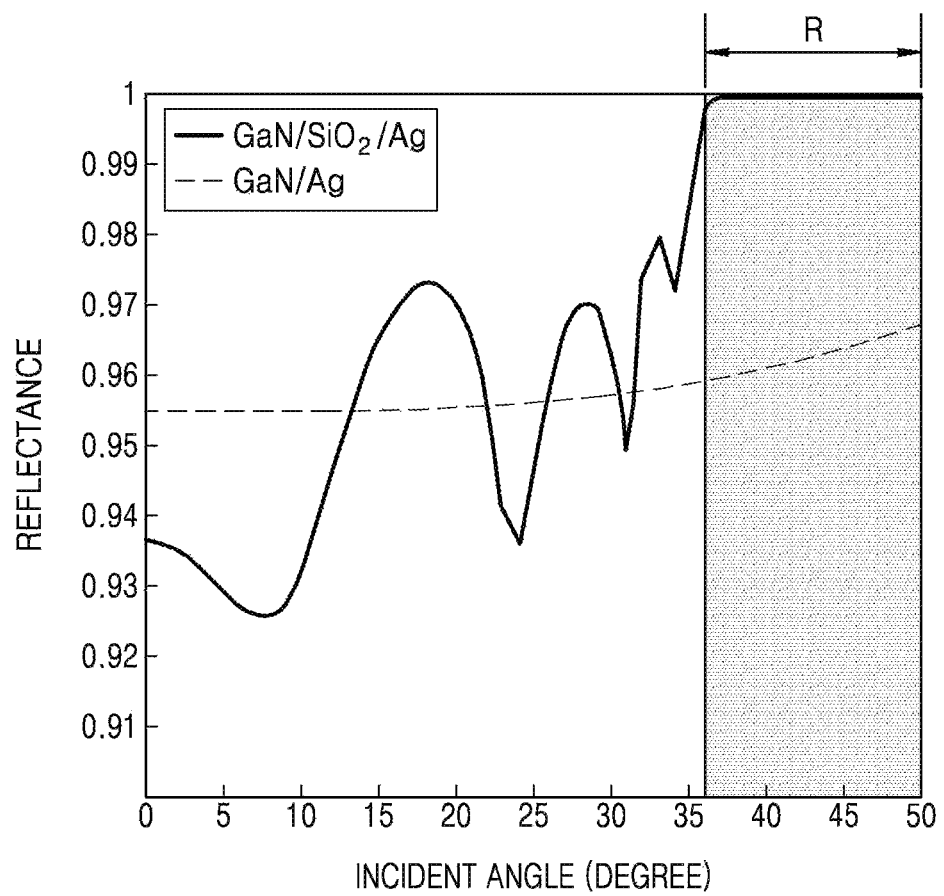
FIG. 5 is a graph showing reflectance with respect to an angle of incidence of a light-emitting device according to an embodiment of the inventive concept.

FIG. 5 is a graph showing reflectance with respect to an angle of incidence of a light-emitting device according to an embodiment of the inventive concept.

Referring to FIG. 5, the graph compares light reflectance (shown by a dashed line, hereinafter referred to as a first reflectance) that is generated in a light-emitting device in which a reflective electrode layer (Ag) contacts a light-emitting structure (GaN), and light reflectance (shown by a solid line, hereinafter referred to as a second reflectance) that is generated in a light-emitting device manufactured by forming a dielectric layer (SiO$_2$) between the light-emitting structure (GaN) and the reflective electrode layer (Ag).

Looking at the first reflectance, it can be seen that as the angle of incidence of light increases from about 0° to about 50°, the first reflectance also increases from about 0.95 to about 0.97. However, it can be seen that total reflection R does not occur at any angle of incidence in the first reflectance.

Looking at the second reflectance, it can be seen that as the angle of incidence of light increases from about 0° to about 50°, the second reflectance increases or decreases between about 0.925 and about 1. It can be seen that total reflectance R occurs, in the second reflectance, in a region where the angle of incidence is equal to or greater than about 37°.

A region where total reflection of light occurs may increase by adjusting the angle of incidence of light and modifying a shape of the light-emitting structure to increase the second reflectance of light. When a total reflection effect is obtained by forming a dielectric layer, an overall extraction efficiency of light may be improved.

For example, as an area where the dielectric layer is removed increases, the area where total reflection occurs may decrease, which may cause a decrease of light extraction efficiency. The light-emitting device 100 and the light-emitting device package 1000 according to an embodiment of the inventive concept may be provided with a plurality of transmissive conductive layers and a plurality of dielectric pattern layers based on data on the first and second reflectance, e.g., illustrated in FIG. 5.

Figure 6:
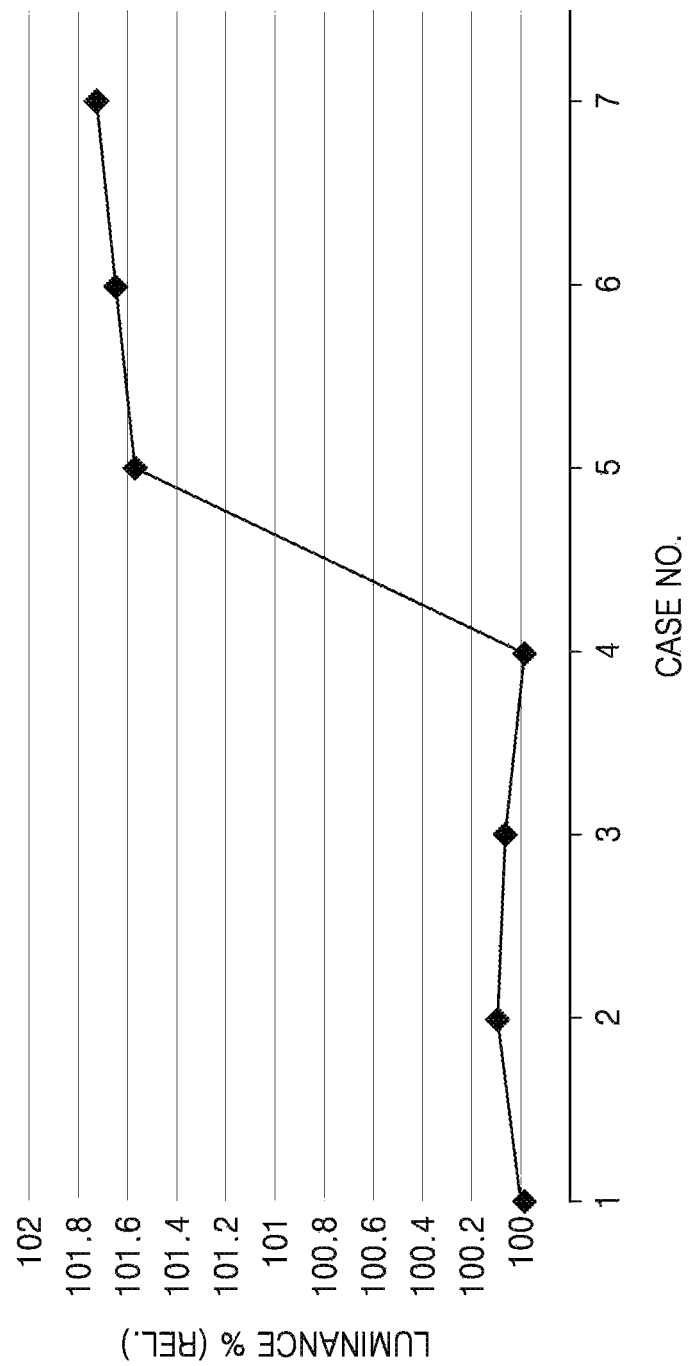
FIG. 6 is a graph showing relative reflection efficiency of light-emitting devices having different reflection structures from each other.

FIG. 6 is a graph showing relative reflectance efficiency of light-emitting devices having different reflection structures from each other.

Referring to FIG. 6, the graph compares reflectance efficiency of light in the light-emitting devices in which the reflective electrode layers contact the light-emitting structures (cases 1 through 4), and reflectance efficiency in the light-emitting devices which are manufactured by forming the dielectric layers between the light-emitting structures and the reflective electrode layers (cases 5 through 7). The reflectance efficiency means a relative reflectance efficiency. For example, FIG. 6 shows values of relative luminance of the samples. For example, case 1 is a reference case in which a base luminance is measured, and the luminance is set as a relative luminance value 100. Values of luminance of the other cases are expressed as relative values of luminance with respect to the luminance of the case 1. Cases 5, 6 and 7 shows about 1.7% higher luminance than the reference case 1. For example, FIG. 6 shows luminance improvement of certain embodiments of the present disclosure.

Looking at the cases 1 through 4, it can be seen that the reflectance efficiency is equal to or less than about 10%. For example, it may be understood that, when the dielectric layer is not formed, total reflection effect may not be obtained and thus, the reflectance efficiency may be relatively low.

Looking at the cases 5 through 7, it can be seen that the reflectance efficiency is equal to or greater than about 44%. For example, it may be understood that, when the dielectric layer is formed, the total reflection effect may be obtained and thus, the reflectance efficiency may be relatively high.

For example, among the cases 5 through 7, the case 5 is a case where the reflective electrode layer is formed by removing a portion of the dielectric layer, and the cases 6 and 7 are cases where the total reflection effect increases by forming each of the transmissive conductive layer and the dielectric pattern layer in a plurality of layers like the light-emitting device 100 according to some embodiments of the inventive concept.

The reflectance efficiency of the case 5 may be about 44% and those of the cases 6 and 7 may be about 45% or greater according to measurements. For example, it can be seen that the light-emitting device 100 and the light-emitting device package 1000 according to an embodiment of the present invention increase the total reflection effect and improve the light extraction efficiency as a whole.

Figure 7:
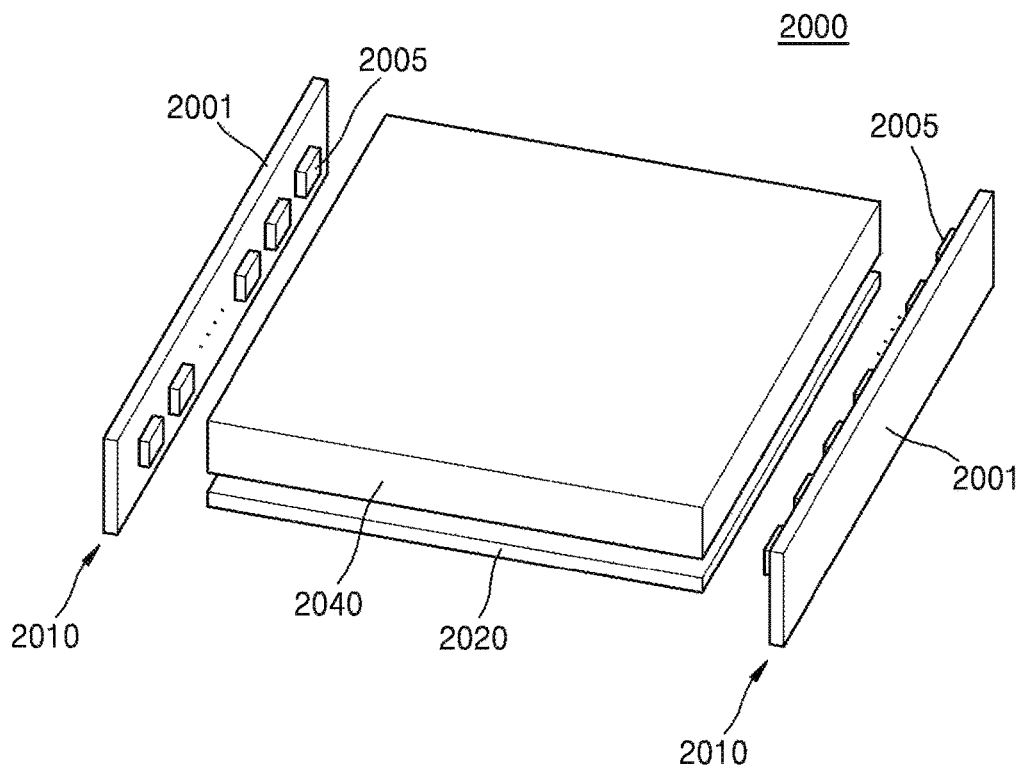
FIG. 7 is a schematic perspective view of a backlight unit including a light-emitting device, according to an embodiment of the inventive concept.

FIG. 7 is a schematic perspective view of a backlight unit 2000 including a light-emitting device according to an embodiment of the inventive concept.

The backlight unit 2000 may include a light guide plate 2040 and a light source module 2010 arranged on both sides of the light guide plate 2040. In addition, the backlight unit 2000 may further include a reflecting plate 2020 under the light guide plate 2040. The backlight unit 2000 according to the embodiment may be an edge-type backlight unit. According to an embodiment, the light source module 2010 may be provided only on one side of the light guide plate 2040 or may be additionally provided on the other side of the light guide plate 2040. The light source module 2010 may include a printed circuit board 2001 and a plurality of light sources 2005 mounted on a top surface of the printed circuit board 2001. The light source 2005 may be a light-emitting device 100 and/or a light-emitting device package 1000 according to an embodiment of the inventive concept described above.

Figure 8:
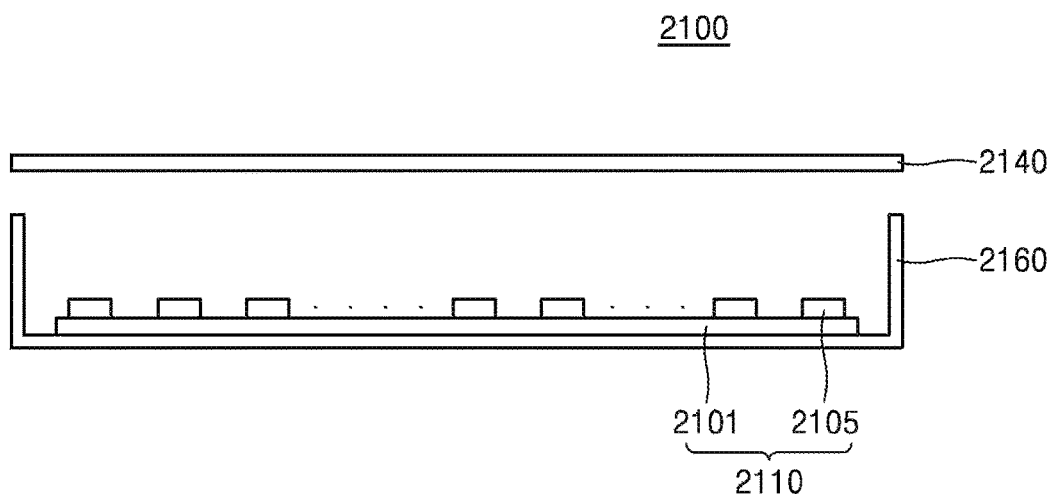
FIG. 8 is a cross-sectional view illustrating a direct-type backlight unit including a light-emitting device according to an embodiment of the inventive concept.

FIG. 8 is a cross-sectional view illustrating a direct-type backlight unit 2100 including a light-emitting device according to an embodiment of the inventive concept.

The direct-type backlight unit 2100, may include a light diffusion plate 2140 and a light source module 2110 below the light diffusion plate 2140. In addition, the direct-type backlight unit 2100 may further include a bottom case 2160 arranged below the light diffusion plate 2140 and accommodating the light source module 2110.

The light source module 2110 may include a printed circuit board 2101 and a plurality of light sources 2105 mounted on a top surface of the printed circuit board 2101. Each of the light sources 2105 may be a light-emitting device 100 and/or a light-emitting device package 1000 according to an embodiment of the inventive concept described above.

Figure 9:
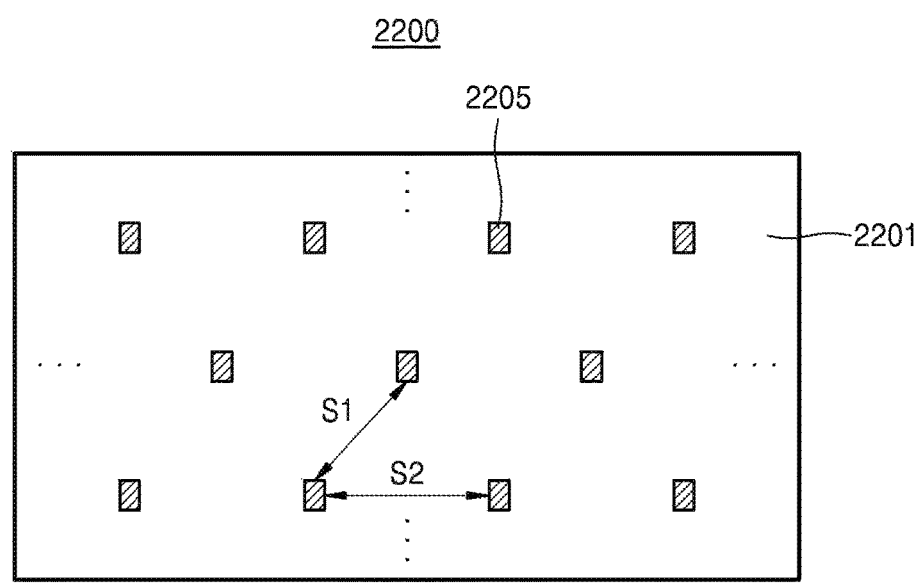
FIG. 9 is a plan view illustrating a direct-type backlight unit including a light-emitting device according to an embodiment of the inventive concept.

FIG. 9 is a plan view illustrating a direct-type backlight unit 2200 including a light-emitting device according to an embodiment of the inventive concept.

FIG. 9 illustrates an example arrangement of a light source 2205 in the direct-type backlight unit 2200. The light source 2205 may be a light-emitting device 100 and/or a light-emitting device package 1000 according to an embodiment of the inventive concept described above.

The direct-type backlight unit 2200 according to an embodiment may include a plurality of light sources 2205 arranged on a substrate 2201. A structure of arranging the light sources 2205 may be a matrix structure arranged in rows and columns, and each row and column may have a zigzag shape. The structure may be a structure in which a plurality of light sources 2205 are arranged in a first matrix arranged in rows and columns on straight lines, and a second matrix of the same type as the first matrix is arranged inside the first matrix. It may be understood as that each light source 2205 of the second matrix is placed inside a square formed by four adjacent light sources 2205 included in the first matrix. For example, the first matrix may comprise odd rows of the plurality of light sources 2205, and the second matrix may comprise even rows of the plurality of light sources 2205. For example, the light sources 2205 may be arranged in a matrix form in which elements of even rows are shifted by a half of a horizontal interval between two adjacent elements with respect to elements of odd rows as shown in FIG. 9. In certain embodiments, the first matrix may comprise odd columns of the plurality of light sources 2205, and the second matrix may comprise even columns of the plurality of light sources 2201. For example, the light sources 2205 may be arranged in a matrix form in which elements of even columns are shifted by a half of a vertical interval between two adjacent elements with respect to elements of odd columns.

However, in order to improve uniformity of brightness and light efficiency in the direct-type backlight unit 2200, the first matrix and the second matrix may have different arrangement structures and intervals as needed. In addition to the method of arranging the plurality of light sources 2205, distances S1 and S2 between adjacent light sources 2205 may be optimized so as to secure luminance uniformity. By arranging the rows and columns of the light sources 2205 in a zigzag manner, not on straight lines, it may reduce the number of the light sources 2205 by about 15% to about 25%, e.g., compared to straight columns and rows arrangement of the light sources 2205.

Figure 10:
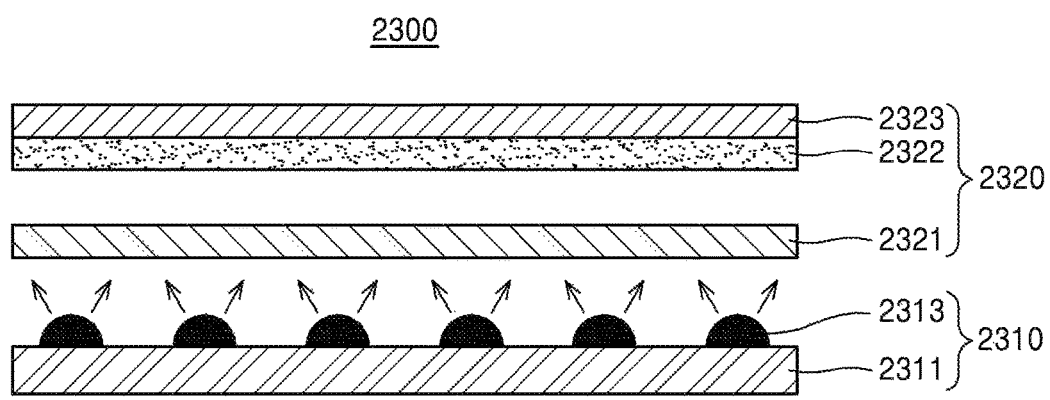
FIG. 10 is a cross-sectional view illustrating a direct-type backlight unit including a light-emitting device according to an embodiment of the inventive concept.
Figure 11:
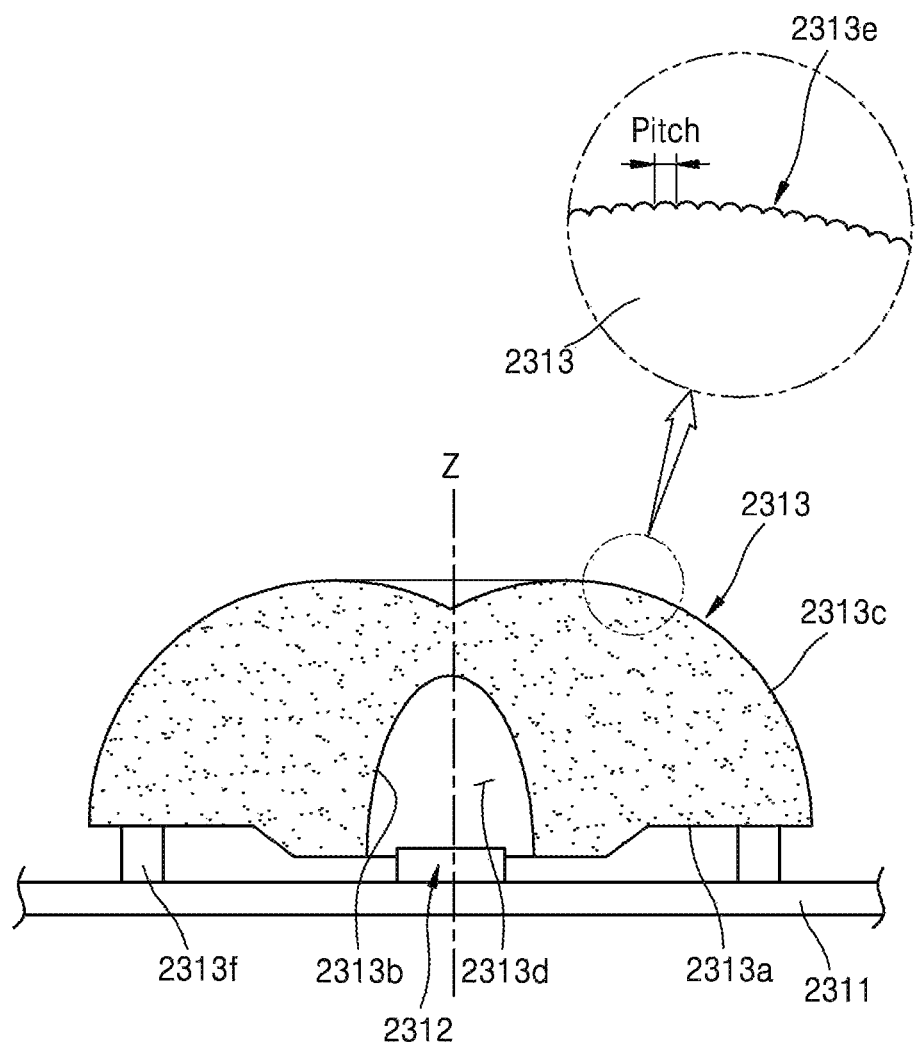
FIG. 11 is an enlarged view illustrating a light source module shown in FIG. 10.

FIG. 10 is a cross-sectional view for explaining a direct-type backlight unit 2300 including a light-emitting device 100 according to an embodiment of the inventive concept. FIG. 11 is an enlarged view of the light source module 2310 in FIG. 10.

The direct-type backlight unit 2300 according to an embodiment of the inventive concept may include an optical sheet 2320 and the light source module 2310 under the optical sheet 2320. The optical sheet 2320 may include a diffusion sheet 2321, a light condensing sheet 2322, a protective sheet 2323, and the like.

The light source module 2310 may include a circuit board 2311, a plurality of light sources 2312 mounted on the circuit board 2311, and a plurality of optical elements 2313 respectively arranged on the plurality of light sources 2312. The light source 2312 may be a light-emitting device 100 and/or a light-emitting device package 1000 according to an embodiment of the inventive concept described above.

The optical element 2313 may adjust a direction angle of light via refraction, and may use a light direction angle lens that diffuses light of the light source 2312 in a broad area. For example, the optical element 2313 may change traveling directions of light coming from the light sources 2312. For example, the optical element 2313 may include lenses that diffuse and/or refract the light coming from the light sources 2312 so that the light element 2313 has a broad light distribution. Since the light source 2312 in combination with the optical element 2313 has a broader optical distribution, the number of the light sources 2312 disposed for the same area may be reduced when the light source module 2310 is used for backlighting, flat panel illumination, and the like.

As illustrated in FIG. 11, the optical element 2313 may include a bottom surface 2313a on the light source 2312, an incident surface 2313b on which light from the light source 2312 is incident, and an emission surface 2313c. The bottom surface 2313a may be provided with a groove unit 2313d recessed in a direction of the emission surface 2313c at the center through which the optical axis Z of the light source 2312 passes. A surface of the groove unit 2313d may be defined as the incident surface 2313b on which light of the light source 2312 is incident. For example, the incident surface 2313b may form the surface of the groove unit 2313d.

The bottom surface 2313a may have a central region connected to the incident surface 2313b and partially protruded toward the light source 2312, and thus, may have an overall non-planar structure. For example, unlike a general structure in which an entire region of the bottom surface 2313a is flat, the bottom surface 2313a may have a structure partially protruding along a circumference of the groove unit 2313d. A plurality of supporting members 2313f may be arranged on the bottom surface 2313a, and may fix and support the optical element 2313 when the optical element 2313 is mounted on the circuit board 2311. For example, the plurality of supporting members 2313f may be disposed between the optical element 2313 and the circuit board 2311. For example, the plurality of supporting members 2313f may be in contact with the bottom surface 2313a and the circuit board 2311 as shown in FIG. 11.

The emission surface 2313c may protrude in a dome shape from a rim connected to the bottom surface 2313a in an upward direction (light-emitting direction), and may have a structure having an inflection point due to the center, through which the optical axis Z passes, being recessed toward the groove unit 2313d. For example, the emission surface 2313c may have a dome shape including a recessed portion at the center. The recessed portion of the dome may be a reflection point in a cross-sectional view as shown in FIG. 11. A plurality of uneven portions 2313e may be periodically arranged on the emission surface 2313c in a direction of the rim from the optical axis Z. The plurality of uneven portions 2313e may have a ring shape corresponding to a horizontal cross-sectional shape of the optical element 2313 and may form concentric circles based on the optical axis Z. The plurality of uneven portions 2313e may be arranged in a radially diffusing structure while forming a periodic pattern along a surface of the emission surface 2313c with the optical axis Z as a center. For example, in a microscopic view, the emission surface 2313c may be embossed with a plurality of hemisphere protrusions.

The plurality of uneven portions 2313e may be spaced apart from each other by a certain pitch to form a pattern. In this case, the period between the plurality of uneven portions 2313e may have a range between about 0.01 mm and about 0.04 mm. The plurality of uneven portions 2313e may offset differences in performance between the optical elements due to minute processing errors that may occur in processes of manufacturing the optical elements 2313, and this may improve uniformity of light distribution.

Figure 12:
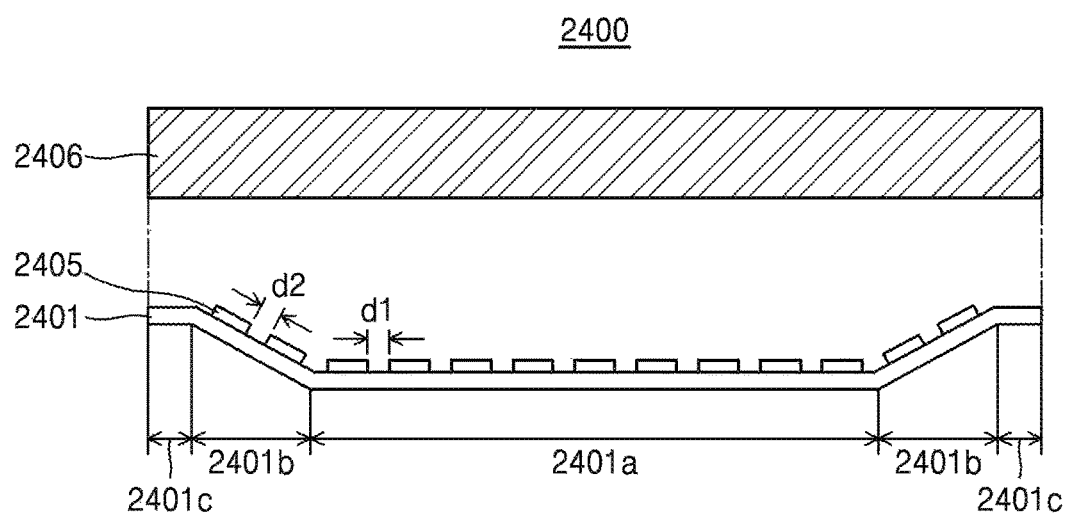
FIG. 12 is a cross-sectional view illustrating a direct-type backlight unit including a light-emitting device according to an embodiment of the inventive concept.

FIG. 12 is a cross-sectional view for explaining a direct-type backlight unit 2400 including a light-emitting device according to an embodiment of the inventive concept.

The direct-type backlight unit 2400 may include a light source 2405 mounted on a circuit board 2401 and may include one or more optical sheets 2406 on a top surface thereof. The light source 2405 may be a white color light-emitting device containing a red color phosphor. The light source 2405 may be a module mounted on the circuit board 2401. The light source 2405 may be a light-emitting device 100 and/or a light-emitting device package 1000 according to an embodiment of the inventive concept described above.

The circuit board 2401 employed in the embodiment may include a first flat surface portion 2401a corresponding to a main region, an inclined portion 2401b arranged around the first flat surface portion 2401a and at least partially bent, and a second flat surface portion 2401c at an edge of the circuit board 2401 outside the inclined portion 2401b. The light source 2405 may be arranged on the first flat surface portion 2401a at a first interval d1 and one or more light sources 2405 may be arranged on the inclined portion 2401b at a second interval d2. The first interval d1 may be equal to the second interval d2. A width (or a length in a cross section) of the inclined portion 2401b may be less than that of the first flat surface portion 2401a and greater than that of the second flat surface portion 2401c. For example, at least one light source 2405 may be arranged in the second flat surface portion 2401c as needed.

A slope of the inclined portion 2401b may be appropriately adjusted within a range greater than about 0° and less than about 90° with respect to the first flat surface portion 2401a. By taking such a structure, the circuit board 2401 may maintain a uniform brightness even in the vicinity of the edge of the optical sheet 2406.

Figure 13:
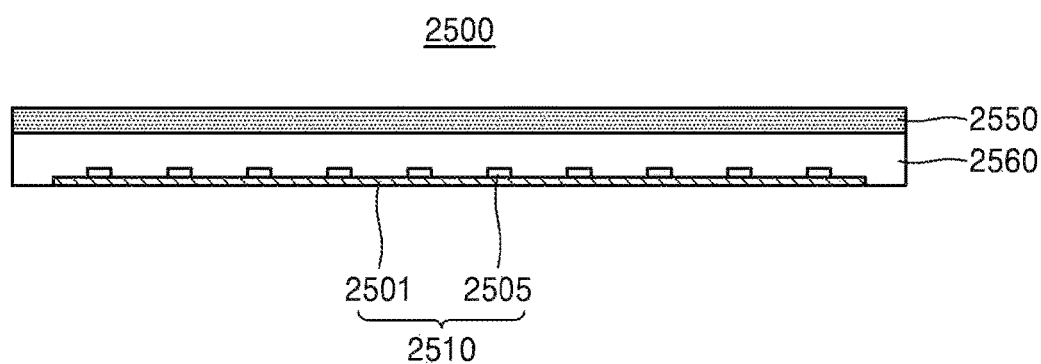
FIGS. 13 through 15 illustrates backlight units including a light-emitting device according to an embodiment of the inventive concept.
Figure 14:
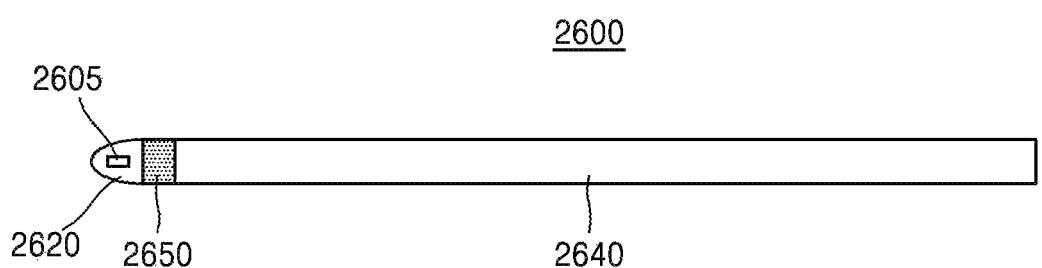
Figure 15:
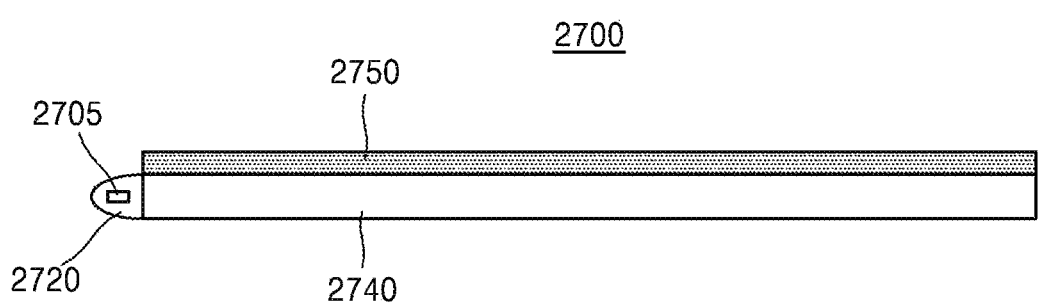

FIGS. 13 through 15 are cross-sectional views for explaining backlight units 2500, 2600, and 2700 including a light-emitting device according to an embodiment of the inventive concept.

Wavelength converters 2550, 2650, and 2750 may not be in the light sources 2505, 2605, and 2705, but may be outside of the light sources 2505, 2605, and 2705 and in the backlight units 2500, 2600, and 2700, and may convert light. Each of the light sources 2505, 2605, and 2705 may be a light-emitting device 100 and/or a light-emitting device package 1000 according to an embodiment of the inventive concept described above.

The backlight unit 2500 shown in FIG. 13 may be a direct-type backlight unit and include a wavelength converter 2550, a light source module 2510 below the wavelength converter 2550, and a bottom case 2560 accommodating the light source module 2510. For example, the light source module 2510 may include a printed circuit board 2501 and a plurality of light sources 2505 mounted on a top surface of the printed circuit board 2501.

The backlight unit 2500, may include the wavelength converter 2550 above the bottom case 2560. For example, wavelength of at least a portion of light emitted from the light source module 2510 may be converted by the wavelength converter 2550. The wavelength converter 2550 may be manufactured with a separate film and be applied, but may be provided in a form integrated with a light diffusion plate (not illustrated).

The backlight units 2600 and 2700 of FIGS. 14 and 15 may be edge-type backlight units and may include wavelength converters 2650 and 2750, light guide plates 2640 and 2740, reflectors 2620 and 2720 on one side of the light guide plates 2640 and 2740, respectively, and the light sources 2605 and 2705. Light emitted from the light sources 2605 and 2705 may be guided into the light guide plates 2640 and 2740 by the reflectors 2620 and 2720. In the backlight unit 2600 of FIG. 14, the wavelength converter 2650 may be between the light guide plate 2640 and the light source 2605. In the backlight unit 2700 of FIG. 15, the wavelength converter 2750 may be between the light guide plate 2740 and the light source 2705. In certain embodiments, the wavelength converter 2750 may be between the light guide plate 2740 and a display panel (not shown). For example, in certain embodiments, the light coming from the light source 2705 may be converted after the light passes through the light guide plate 2740.

The wavelength converters 2550, 2650, and 2750 may include conventional phosphors. For example, a quantum dot phosphor may be used to compensate for characteristics of quantum dots susceptible to heat or moisture from a light source. For example, a quantum dot phosphor may be applied to the wavelength converters 2550, 2650 and 2750, and a quantum dot phosphor may be advantageous for controlling color spectrum of a display.

Figure 16:
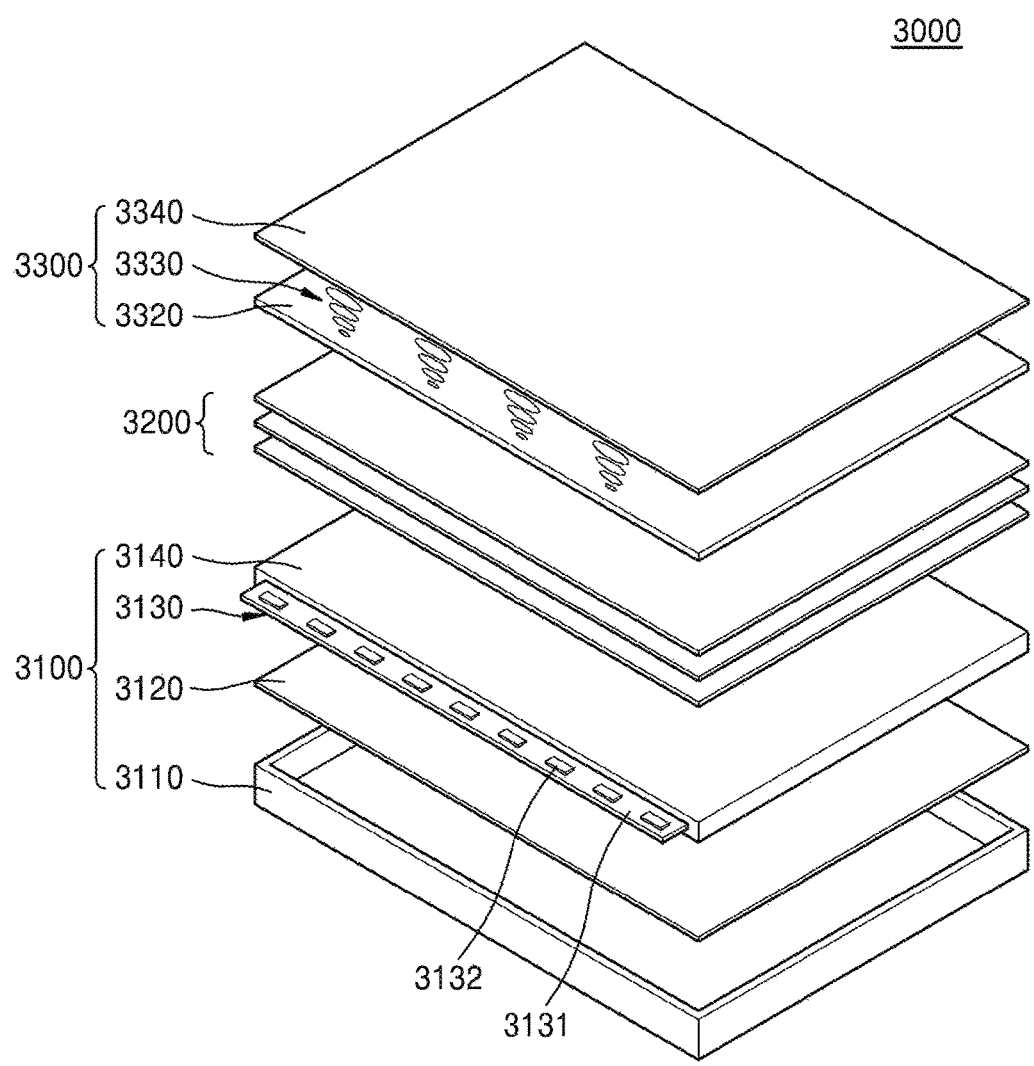
FIG. 16 is a schematic exploded perspective view of a display apparatus including a light-emitting device according to an embodiment of the inventive concept.

FIG. 16 is a schematic exploded perspective view of a display apparatus 3000 including a light-emitting device according to an embodiment of the inventive concept.

The display apparatus 3000 may include a backlight unit 3100, an optical sheet 3200, and an image display panel 3300 such as a liquid crystal panel. The backlight unit 3100 may include a light source module 3130 on at least one side of a bottom case 3110, a reflecting plate 3120, and a light guide plate 3140. The light source module 3130 may include a printed circuit board 3131 and a light source 3132.

For example, the light source 3132 may be a side-view type light-emitting device mounted on a side adjacent to a light-emitting surface. For example, the light source 3132 may be mounted on the printed circuit board 3131 for the light emitted from the light source 3132 to be incident on a side of the light guide plate 3140. The light source 3132 may be a light-emitting device 100 and/or a light-emitting device package 1000 according to an embodiment of the inventive concept described above. The optical sheet 3200 may include various sheets such as a prism sheet and a protection sheet.

The image display panel 3300 may display an image by using light emitted from the optical sheet 3200. The image display panel 3300 may include an array substrate 3320, a liquid crystal layer 3330, and a color filter substrate 3340. The array substrate 3320 may include pixel electrodes in a matrix form, thin film transistors for applying a driving voltage to the pixel electrodes, and signal lines for operating the thin film transistors.

The color filter substrate 3340 may include a transparent substrate, a color filter, and a common electrode. The color filter may include filters for selectively transmitting light of a specific wavelength among white color light emitted from the backlight unit 3100. The liquid crystal layer 3330 may be rearranged by an electric field formed between the pixel electrode and the common electrode to control the light transmittance. Light having the adjusted light transmittance may display an image by passing through the color filter of the color filter substrate 3340. The image display panel 3300 may further include a drive circuit unit and the like for processing a video signal.

According to the display apparatus 3000 of the present embodiment, each light source 3132 may emit blue color light, green color light, and/or red color light having a relatively small FWHM (full width at half maximum), and high color purities of blue color, green color, and red color may be realized after the emitted light has passed through the color filter substrate 3340.

Figure 17:
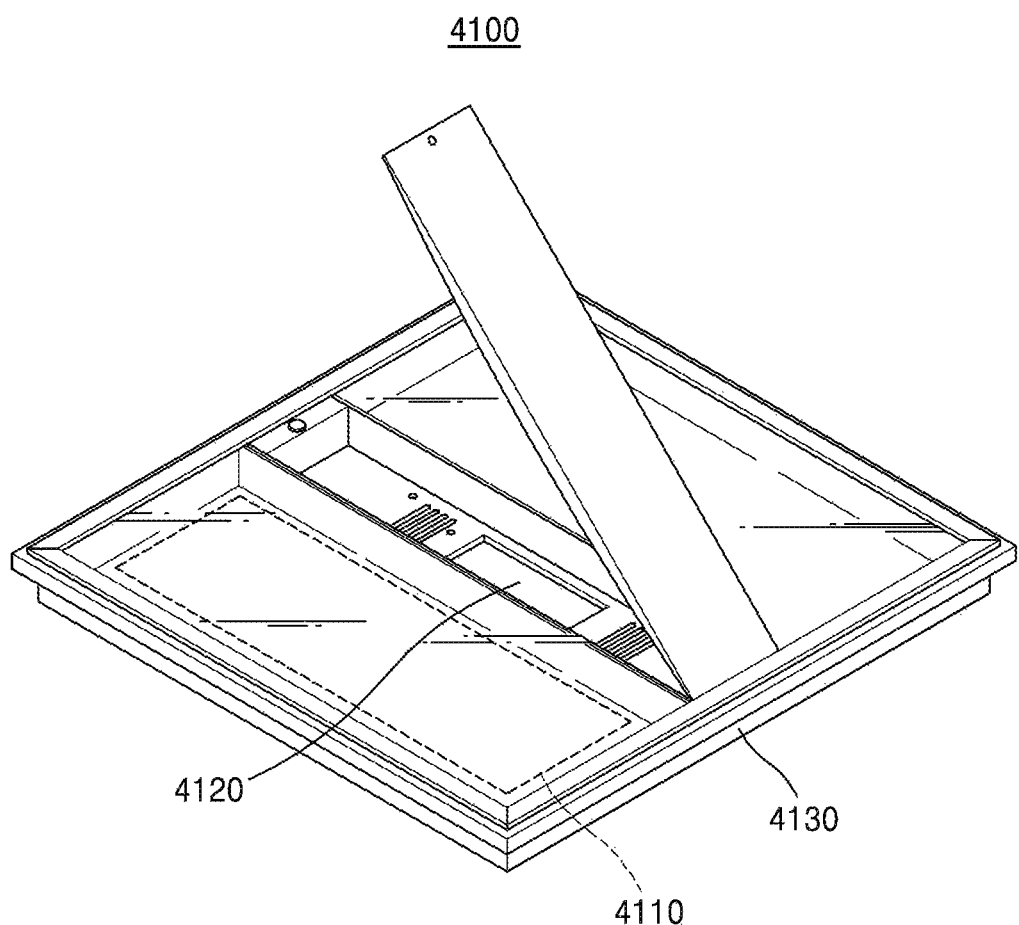
FIG. 17 is a perspective view schematically showing a flat panel lighting apparatus including a light-emitting device according to an embodiment of the inventive concept.

FIG. 17 is a perspective view schematically showing a flat panel lighting apparatus 4100 including a light-emitting device according to an embodiment of the inventive concept.

The flat panel lighting apparatus 4100 may include a light source module 4110, a power supply 4120, and a housing 4030. The light source module 4110 may include a light-emitting device array as a light source. The light source module 4110 may include a light-emitting device 100 and/or a light-emitting device package 1000 according to an embodiment of the inventive concept described above as a light source. The power supply 4120 may include a light-emitting device driver.

The light source module 4110 may include a light-emitting device array, and may be formed to have flatness as a whole. For example, the light source module 4110 including the light-emitting device array may be flat overall. The light-emitting device array may include a light-emitting device and a controller for storing driving information of the light-emitting device.

The power supply 4120 may be configured to supply power to the light source module 4110. The housing 4130 may have a receiving space such that the light source module 4110 and the power supply 4120 are received therein, and may be formed in a hexahedron shape opened on one side, but embodiments are not limited thereto. The light source module 4110 may be arranged to emit light to one opened side of the housing 4130.

Figure 18:
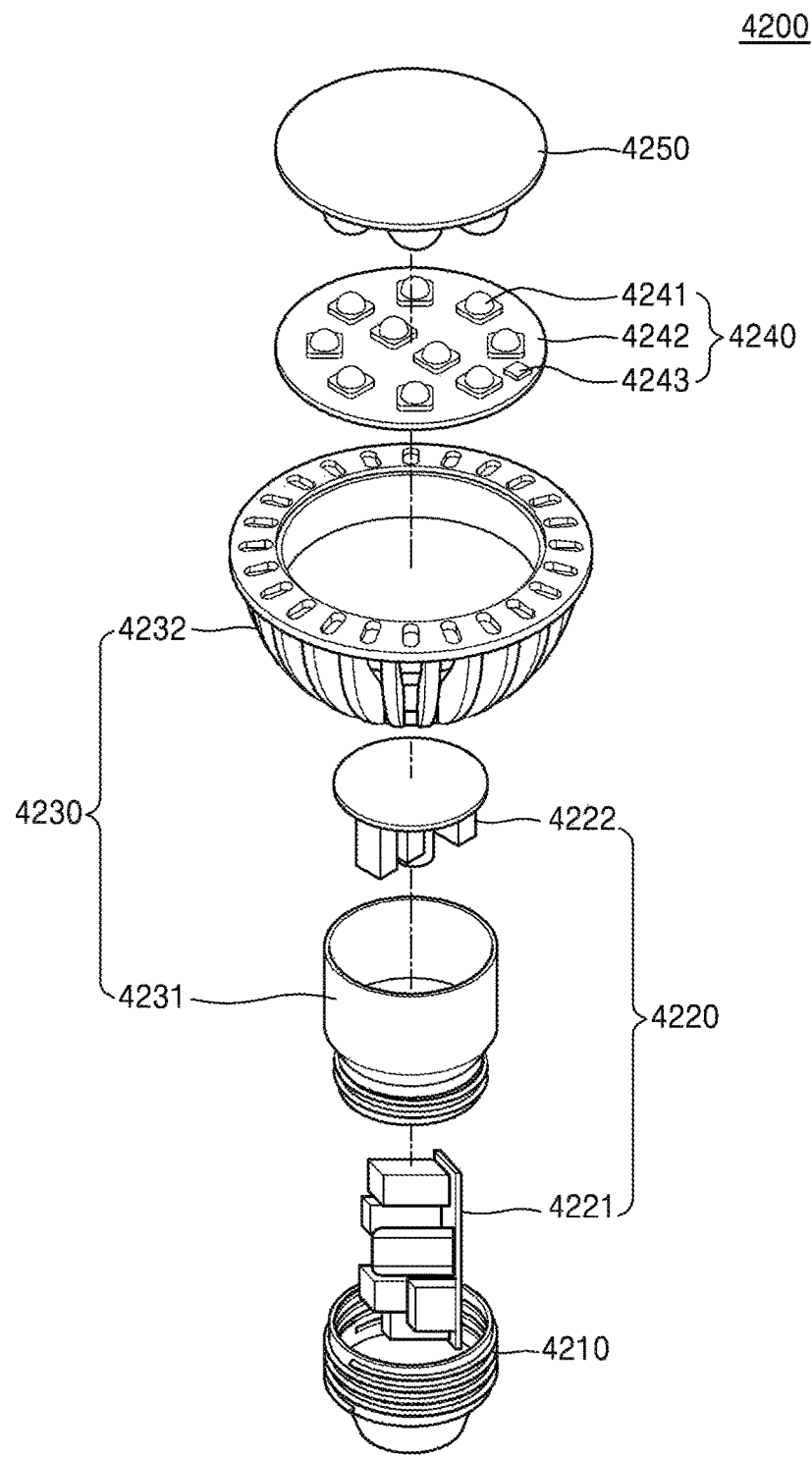
FIG. 18 is an exploded perspective view schematically showing a lighting apparatus including a light-emitting device according to an embodiment of the inventive concept.

FIG. 18 is an exploded perspective view schematically showing a lighting apparatus 4200 including a light-emitting device according to an embodiment of the inventive concept.

The lighting apparatus 4200 may include a socket 4210, a power supply 4220, a heat dissipating unit 4230, a light source module 4240, and an optical unit 4250. The light source module 4240 may include a light-emitting device array, and the power supply 4220 may include a light-emitting device driver.

The socket 4210 may be configured to be replaceable with an existing lighting apparatus. Power supplied to the lighting apparatus 4200 may be applied via the socket 4210. As illustrated in FIG. 18, the power supply 4220 may include and be assembled with a first power supply unit 4221 and a second power supply unit 4222, which are separable. The heat dissipating unit 4230 may include an internal heat dissipating unit 4231 and an external heat dissipating unit 4232, and the internal heat dissipating unit 4231 may be directly connected to the light source module 4240 and/or the power supply 4220 so that heat may be transmitted to the external heat dissipating unit 4232 therethrough. The optical unit 4250 may include an internal optical unit (not illustrated) and an external optical unit (not illustrated), and may be configured to evenly distribute light emitted by the light source module 4240.

The light source module 4240 may receive power from the power supply 4220 and emit light to the optical unit 4250. The light source module 4240 may include one or more light-emitting device packages 4241, a circuit board 4242, and a controller 4243, and the controller 4243 may store driving information of the light-emitting device package 4241. The light source device package may include a light-emitting device 100 and/or a light-emitting device package 1000 according to an embodiment of the inventive concept described above.

Figure 19:
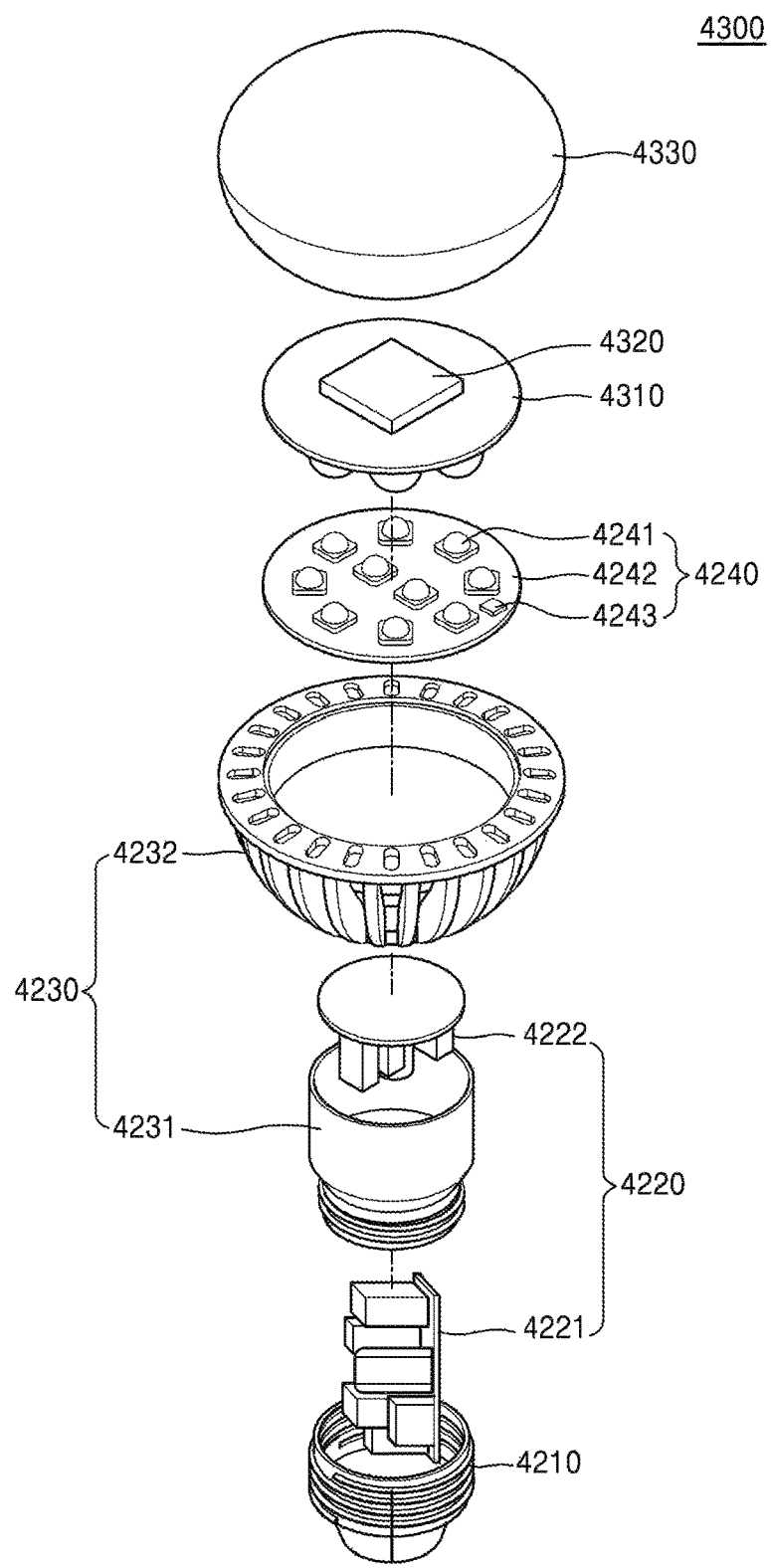
FIG. 19 is an exploded perspective view schematically showing a lighting apparatus including a light-emitting device according to an embodiment of the inventive concept.

FIG. 19 is an exploded perspective view schematically showing a lighting apparatus 4300 including a light-emitting device according to an embodiment of the inventive concept.

The lighting apparatus according to the present embodiment is different from the lighting apparatus 4200 disclosed in FIG. 18 in that a reflecting plate 4310 and a communication module 4320 are arranged above the light source module 4240. The reflecting plate 4310 may reduce glaring by evenly spreading light from light sources to the side and back thereof.

The communication module 4320 may be mounted on the reflecting plate 4310 and a home-network communication may be implemented via the communication module 4320. For example, the communication module 4320 may be a wireless communication module using Zigbee, WiFi or LiFi, and may control lighting operations such as on/off and brightness control of lighting apparatuses installed inside and/or outside a home via a smart phone or a wireless controller. For example, a LiFi communication may control electronic devices and vehicle systems, such as a TV, a refrigerator, an air-conditioner, a door-lock, and a car, which are installed inside and/or outside the home, by using visible ray wavelengths of lighting apparatuses installed inside and/or outside the home. The reflecting plate 4310 and the communication module 4320 may be covered by a cover unit 4330.

Figure 20:
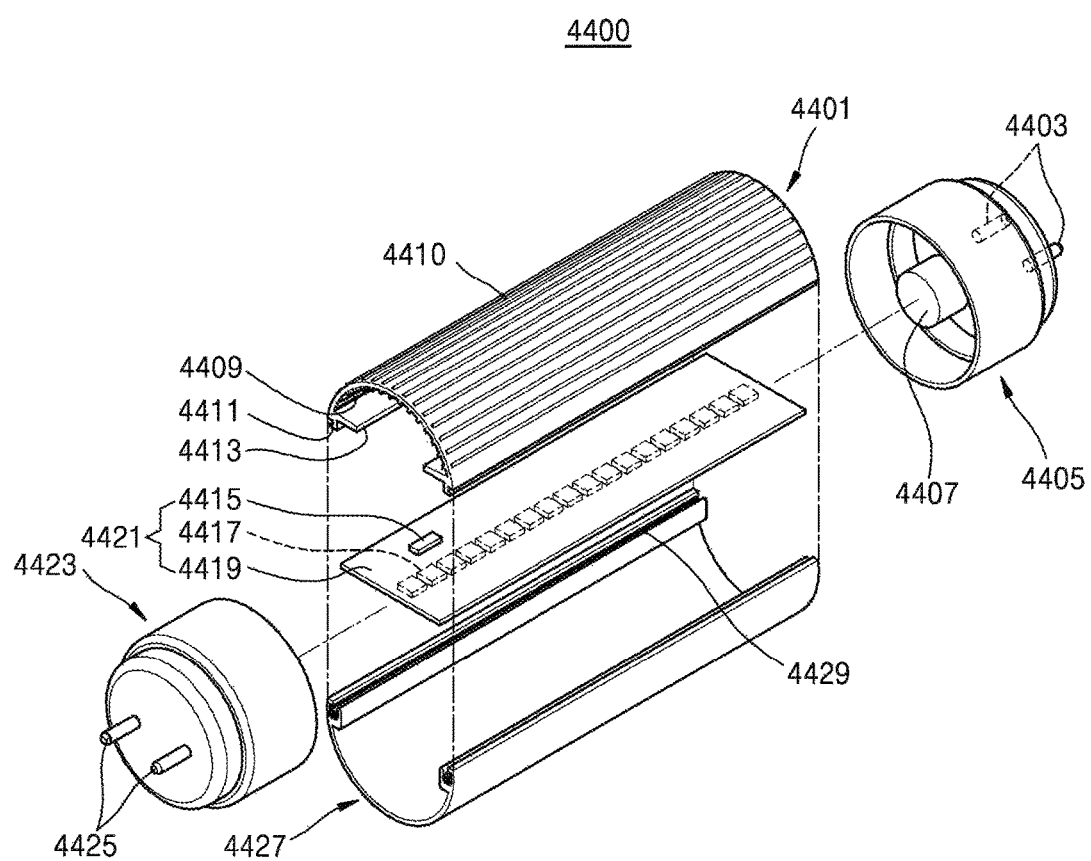
FIG. 20 is an exploded perspective view schematically showing a bar-type lighting apparatus including a light-emitting device according to an embodiment of the inventive concept.

FIG. 20 is an exploded perspective view schematically showing a bar-type lighting apparatus 4400 including a light-emitting device according to an embodiment of the inventive concept.

The bar-type lighting apparatus 4400 may include a heat dissipating member 4401, a cover 4427, a light source module 4421, a first socket 4405, and a second socket 4423. A plurality of heat dissipating fins 4409 and 4410 may be formed in uneven shapes on inner and/or outer surfaces of the heat dissipating member 4401, and the heat dissipation fins 4409 and 4410 may be designed to have various shapes and intervals. For example, the heat dissipation fins 4409 and 4410 may be respectively formed to protrude from the inner and outer surfaces of the heat dissipation member 4401. A protruding support base 4413 may be formed on an inner side of the heat dissipating member 4401. The light source module 4421 may be fixed to the support base 4413. A latching protrusion 4411 may be formed at both ends of the heat dissipating member 4401.

The cover 4427 may be formed with a latching groove 4429, and the latching protrusion 4411 of the heat dissipating member 4401 may be combined to the latching groove 4429 in a hook coupling structure. The positions where the latching grooves 4429 and the latching protrusion 4411 are formed may be mutually exchanged. For example, the latching groove 4429 may be formed at both ends of the beat dissipating member 4401, and the latching protrusion 4411 may be formed in the cover 4427.

The light source module 4421 may include a light-emitting device array. The light source module 4421 may include a printed circuit board 4419, a light source 4417, and a controller 4415. The controller 4415 may store driving information of the light source 4417. Circuit wirings for operating the light source 4417 may be formed on the printed circuit board 4419. For example, components for operating the light source 4417 may be included. The light source 4417 may be the light-emitting device 100 and/or the light-emitting device package 1000 according to an embodiment of the inventive concept described above.

The first and second sockets 4405 and 4423, as a pair of sockets, may have a structure in which the first and second sockets 4405 and 4423 are combined to both ends of a cylindrical cover unit composed of the heat dissipating member 4401 and the cover 4427. For example, the first socket 4405 may include an electrode terminal 4403 and a power supply 4407, and the second socket 4423 may be provided with a dummy terminal 4425. For example, an optical sensor and/or a communication module may be embedded in any one socket of the first socket 4405 and the second socket 4423. For example, an optical sensor and/or a communication module may be embedded in the second socket 4423 including the dummy terminal 4425 therein. As another example, an optical sensor and/or a communication module may be embedded in the first socket 4405 including the electrode terminal 4403 therein.

While the inventive concept has been particularly shown and described with reference to embodiments thereof, it will be understood that various changes in form and details may be made therein without departing from the spirit and scope of the following claims.

What is claimed is:

1. A light-emitting device comprising:
   a substrate;
   a light-emitting structure formed on the substrate;
   a first transmissive conductive layer formed on the light-emitting structure;
   a first dielectric pattern layer formed on the first transmissive conductive layer, the first dielectric pattern layer including a plurality of openings;
   a second transmissive conductive layer conformally formed on the first transmissive conductive layer exposed through the plurality of openings and on the first dielectric pattern layer;
   a second dielectric pattern layer filling the plurality of openings; and
   a reflective electrode layer formed on the second transmissive conductive layer and the second dielectric pattern layer.

2. The light-emitting device of claim 1, wherein the light-emitting structure comprises an n-type semiconductor layer, an active layer, and a p-type semiconductor layer, and a refractive index of the p-type semiconductor layer is greater than respective refractive indices of the first and second dielectric pattern layers.

3. The light-emitting device of claim 1, wherein a thickness of the first dielectric pattern layer is greater than that of the second dielectric pattern layer.

4. The light-emitting device of claim 1, wherein a cross-section of the first dielectric pattern layer has a trapezoidal shape including a shorter upper base than a lower base and a cross-section of the second dielectric pattern layer has a trapezoidal shape including a longer upper base than a lower base.

5. The light-emitting device of claim 1, wherein at least one of the first dielectric pattern layer and the second dielectric pattern layer comprises a multilayer structure including material layers having different refractive indices from each other.

6. The light-emitting device of claim 1, wherein the reflective electrode layer comprises silver (Ag) or an alloy of Ag, and a top surface and a bottom surface of the reflective electrode layer are each substantially flat.

7. The light-emitting device of claim 1, wherein an uppermost surface of the second transmissive conductive layer and a top surface of the second dielectric pattern layer are located substantially at a same level.

8. The light-emitting device of claim 1, wherein an area of contact between the second transmissive conductive layer and the reflective electrode layer is greater than an area of contact between the second transmissive conductive layer and the first transmissive conductive layer.

9. The light-emitting device of claim 1, wherein a thickness of the first transmissive conductive layer is greater than that of the second transmissive conductive layer.

10. The light-emitting device of claim 1, wherein each of a thickness of the first transmissive conductive layer and a thickness of the second transmissive conductive layer is equal to or less than about 100 nm.

11. A light-emitting device package comprising:
    a substrate;
    a plurality of light-emitting structures formed on the substrate, each of the light-emitting structures comprising a first conductive semiconductor layer, an active layer, and a second conductive semiconductor layer;
    a first transmissive conductive layer formed on the second conductive semiconductor layer;
    a first dielectric pattern layer formed on the first transmissive conductive layer, the first dielectric pattern layer including a plurality of openings;
    a second transmissive conductive layer conformally formed on the first transmissive conductive layer exposed through the plurality of openings and on the first dielectric pattern layer;
    a second dielectric pattern layer filling the plurality of openings;
    a first electrode layer and a first external connection terminal, each electrically connected to the first conductive semiconductor layer;
    a second electrode layer and a second external connection terminal, each electrically connected to the second conductive semiconductor layer, the second electrode layer being formed on the second transmissive conductive layer and on the second dielectric pattern layer; and
    a module for mounting the substrate and electrically connected to the first and second external connection terminals.

12. The light-emitting device package of claim 11, wherein the first conductive semiconductor layer includes an n-type semiconductor and the second conductive semiconductor layer includes a p-type semiconductor.

13. The light-emitting device package of claim 11, wherein, the light-emitting device package is configured for light emitted from the plurality of light-emitting structures, and incident on the first or second dielectric pattern layer at a certain angle to be totally reflected.

14. The light-emitting device package of claim 11, wherein the second transmissive conductive layer comprises a plurality of prominences and depressions.

15. The light-emitting device package of claim 11, wherein the plurality of light-emitting structures comprises a flip-chip structure, wherein light reflected via the first dielectric pattern layer, the second dielectric pattern layer, or the second electrode layer is emitted through the substrate.

16. A light-emitting device comprising:
- a substrate;
- a light-emitting structure on the substrate;
- a transmissive conductive layer formed on the light-emitting structure and including an internal space;
- a first dielectric pattern layer trapped in the internal space;
- a second dielectric pattern layer which is not trapped in the internal space and includes a top surface located substantially at a same level as a top surface of the transmissive conductive layer; and
- a reflective electrode layer on the transmissive conductive layer and the second dielectric pattern layer.

17. The light-emitting device of claim 16, wherein the second dielectric pattern layer comprises a plurality of circular shapes arranged at regular intervals in a plan view.

18. The light-emitting device of claim 16, wherein the first and second dielectric pattern layers comprise materials having substantially the same refractive indices.

19. The light-emitting device of claim 16, wherein the first dielectric pattern layer is not in contact with the reflective electrode layer.

20. The light-emitting device of claim 16, wherein the reflective electrode layer covers top surfaces of the transmissive conductive layer and the second dielectric pattern layer.

* * * * *